(12) United States Patent
Assion et al.

(10) Patent No.: US 11,774,471 B2
(45) Date of Patent: Oct. 3, 2023

(54) METHOD FOR DISTRIBUTED ELECTRICAL POWER DETERMINATION

(71) Applicant: Beckhoff Automation GmbH, Verl (DE)

(72) Inventors: Fabian Assion, Bielefeld (DE); Christian Lienen, Delbrueck (DE); Jakob Ens, Harsewinkel (DE)

(73) Assignee: Beckhoff Automation GmbH, Verl (DE)

( * ) Notice: Subject to any disclaimer, the term of this patent is extended or adjusted under 35 U.S.C. 154(b) by 106 days.

(21) Appl. No.: 17/387,642

(22) Filed: Jul. 28, 2021

(65) Prior Publication Data

US 2021/0356501 A1 Nov. 18, 2021

Related U.S. Application Data

(63) Continuation of application No. PCT/EP2020/052880, filed on Feb. 5, 2020.

(30) Foreign Application Priority Data

Feb. 11, 2019 (DE) ...................... 10 2019 103 270.9

(51) Int. Cl.
*G01R 21/133* (2006.01)
*G01R 19/25* (2006.01)
(Continued)

(52) U.S. Cl.
CPC ....... *G01R 21/133* (2013.01); *G01R 19/2513* (2013.01); *G01R 21/06* (2013.01); *G01R 22/063* (2013.01)

(58) Field of Classification Search
CPC .. G01R 21/06; G01R 21/133; G01R 19/2513; G01R 22/063
(Continued)

(56) References Cited

U.S. PATENT DOCUMENTS

| 4,581,705 A | 4/1986 | Gilker et al. |
| 6,657,424 B1 | 12/2003 | Voisine et al. |

(Continued)

FOREIGN PATENT DOCUMENTS

| CA | 2105095 A1 | 3/1995 |
| CH | 551627 A | 7/1974 |

(Continued)

OTHER PUBLICATIONS

WO-2009140777 A1, published Nov. 26, 2009, English machine translation (Year: 2009).*

(Continued)

*Primary Examiner* — John H Le
(74) *Attorney, Agent, or Firm* — Dorsey & Whitney LLP

(57) ABSTRACT

A method for distributed electrical power determination of at least one consumer connected to a voltage source via a voltage path, where a voltage measurement device determines a supply voltage of the voltage source at a voltage measurement point and at least one current measurement device determines a consumer current of the consumer at a current measurement point. The method comprises recording measured values of the supply voltage to determine a voltage curve of the supply voltage, recording measured values of the consumer current to determine a current curve of the consumer current, analyzing the measured values of the supply voltage and/or the measured values of the consumer current with an analysis function to determine voltage characteristics of the voltage curve and/or current characteristics of the current curve, and determining at least one power value taking into account the voltage and/or current characteristics.

14 Claims, 10 Drawing Sheets

(51) Int. Cl.
*G01R 21/06* (2006.01)
*G01R 22/06* (2006.01)

(58) Field of Classification Search
USPC .......................................................... 702/61
See application file for complete search history.

(56) References Cited

U.S. PATENT DOCUMENTS

| | | | |
|---|---|---|---|
| 8,476,895 B2 | 7/2013 | Higuma et al. | |
| 10,598,736 B2* | 3/2020 | Luan | H02J 3/00 |
| 2005/0083206 A1 | 4/2005 | Couch et al. | |
| 2008/0195794 A1 | 8/2008 | Banker | |
| 2015/0145500 A1 | 5/2015 | Oshima et al. | |
| 2015/0253364 A1 | 9/2015 | Hieda et al. | |

FOREIGN PATENT DOCUMENTS

| | | | |
|---|---|---|---|
| CN | 101055299 A | 10/2007 | |
| CN | 101925826 A | 12/2010 | |
| CN | 203324412 U | 12/2013 | |
| CN | 104685900 A | 6/2015 | |
| DE | 102011107932 B3 | 1/2013 | |
| DE | 102012022132 A1 | 5/2014 | |
| DE | 102016002267 B4 | 9/2017 | |
| DE | 102019103270 A1 | 8/2020 | |
| EP | 2241898 A1 | 10/2010 | |
| EP | 2902792 A1 | 8/2015 | |
| EP | 2903297 A1 | 8/2015 | |
| EP | 2741054 B1 | 7/2017 | |
| EP | 2732246 B1 | 10/2018 | |
| WO | 2009140777 A1 | 11/2009 | |
| WO | 2013009942 A1 | 1/2013 | |
| WO | 2017144165 A1 | 8/2017 | |
| WO | 2020164998 A1 | 8/2020 | |

OTHER PUBLICATIONS

CN 101055299 A, published Oct. 17, 2007, English machine translation (Year: 2007).*
International Preliminary Report on Patentability in connection with International Patent Application No. PCT/EP2020/052880 dated Feb. 23, 2021, 188 pages including English translation.
International Search Report and Written Opinion for International Patent Application No. PCT/EP2020/052880 dated Apr. 30, 2020, 23 pages including English translation.
Office Action dated Jan. 26, 2022 in connection with Chinese patent application No. 202080012353.7, 21 pages including English translation.
English Translation of CN101055299A, Univ Hunan, Oct. 17, 2007.
English Translation of WO2009140777A1, Gloor Engineering, Nov. 26, 2009.
"EtherCAT—the Ethernet Fieldbus," Beckhoff Automation GmbH, Nov. 2012, 21 pages.

* cited by examiner

METHOD FOR DISTRIBUTED ELECTRICAL POWER DETERMINATION

CROSS-REFERENCE TO RELATED APPLICATIONS

This patent application is a continuation of International Patent Application PCT/EP2020/052880, METHOD FOR THE DISTRIBUTED DETERMINATION OF ELECTRICAL POWER, filed Feb. 5, 2020, and claims the priority of German patent application DE 10 2019 103 270.9, VERFAHREN ZUR VERTEILTEN ELEKTRISCHEN LEISTUNGSBESTIMMUNG, filed Feb. 11, 2019, each of which is hereby incorporated by reference herein, in the entirety and for all purposes.

FIELD

The present application provides a method for distributed electrical power determination for a system having at least one consumer. The present application further provides a system for distributed power determination. The present application additionally provides a computer programmable for executing a method for distributed power determination and a storage medium comprising the computer program.

BACKGROUND

In a distributed power determination, current and voltage of a system with at least one consumer are recorded at different locations in the system. Compared to a power determination in which voltage and current are determined at the same location in the system, e.g. directly at the consumer, a distributed power determination, particularly in systems with several consumers, may have the advantage that only one voltage measurement has to be carried out for several consumers. The value for the supply voltage determined during the voltage measurement is used in combination with the consumer currents determined at the respective locations of the consumers to determine the power. This allows hardware components to be saved, since an individual voltage measurement device is not required for each consumer, but one voltage measurement device is sufficient for a plurality of consumers.

Document WO 2013/009942 A1 discloses a method for distributed power determination in which a voltage measurement is carried out at one location and a current measurement is carried out at another location in a system with at least one consumer.

Document WO 2009/140777 A1 discloses a power measuring device.

However, a problem in the systems known from the prior art for distributed power determination is the transmission of the recorded current and voltage values for determining the power. Since measured values for current and voltage are recorded at different locations in the system and by different system components, at least one data set must be transmitted from one system component to another system component in order to be able to determine the corresponding power, taking into account the recorded voltage and current.

In the case of AC voltage, the power is, in the state of the art, determined on the basis of effective values for current and voltage. This is based, among other things, on the fact that instantaneous values for current and voltage would have to be used to determine the power in an exact manner. However, this would mean transmitting large amounts of data, which leads to problems with current systems.

However, determining power based on effective values for current and voltage is not satisfactory, either. Effective values for current and voltage represent a strong simplification compared to the actual instantaneous values and a large part of the information contained in the instantaneous values is lost in the effective-values simplification. Particularly for systems with comparatively high portions of harmonics in current and voltage, these simplifications lead to measurement inaccuracies in the power determination.

SUMMARY

The application provides an efficient method for distributed electrical power determination in a system having at least one consumer, a system for distributed electrical power determination, and a storage medium having a computer program for executing a method for distributed electrical power determination.

EXAMPLES

A method for distributed electrical power determination of at least one consumer connected to a voltage source via a voltage path is provided, wherein a voltage measurement device determines a supply voltage of the voltage source at a voltage measurement point on the voltage path, and wherein at least one current measurement device determines a supply current of the consumer at a current measurement point on the voltage path. The method comprises the method steps of: recording voltage measured values of the supply voltage by the voltage measurement device to determine a voltage curve of the supply voltage in a voltage measurement step, recording current measured values of a consumer current of the at least one consumer by the at least one current measurement device to determine a current curve of the consumer current in a current measurement step, analyzing the voltage measured values of the supply voltage and/or the current measured values of the consumer current with an analysis function in an analysis step in order to determine voltage characteristics of the voltage curve of the supply voltage and/or current characteristics of the current curve of the consumer current, and determining at least one power value taking into account the voltage characteristics and/or the current characteristics in a power value determination step.

Thereby, an efficient method for distributed power determination in a system with at least one consumer may be provided.

Distributed power determination, which in the following is understood to mean power determination in which voltage and current are measured at different locations in the system, may result in reducing the required hardware.

Particularly in systems with a plurality of consumers, power determination for each of the consumers may be achieved with only one voltage measuring device and a plurality of current measuring devices assigned to the individual consumers.

Individual voltage measurement for each consumer may be avoided. These are particularly disadvantageous for systems in which the supply voltage for the various consumers varies only slightly. In such systems, local voltage measurements for each consumer do not provide any additional information compared to a single global voltage measurement of the supply voltage for the entire system and are consequently redundant.

However, a distributed power determination requires that, in order to determine at least one power value, voltage measured values of the supply voltage and/or current measured values of the consumer current are transmitted from the voltage measurement device and/or from the current measurement device to a corresponding system component, from which the respective measured values of the voltage and the current are used to determine a corresponding power, wherein the measured values comprise voltage measured values and/or current measured values.

In this respect, the advantage is achieved that in the present method a comparatively small volume of data has to be transmitted for the transmission of the information relating to the supply voltage and/or the consumer current obtained from the recorded voltage and current measured values. This allows for faster transmission of the data and, associated with this, faster power determination for the individual consumers of the system.

Due to the higher information density of the parameters, wherein the parameters may be formed by voltage and/or current measured values, compared to non-analyzed voltage and current measured values, a higher information content per transmitted data volume may also be achieved with the transmission of voltage parameters and/or current parameters. With a predetermined maximum transmittable data volume, the transmitted characteristics may thus transmit a higher information content than would be possible with voltage or current measured values of the same data volume. For example, characteristics may be transmitted that correspond to a set of voltage and/or current measured values, the data volume of which would exceed the maximum transmittable data volume. Alternatively, characteristics corresponding to several sets of voltage and/or current measured values may also be transmitted, while not all data sets could be transmitted simultaneously due to the high data volume of the individual data sets of voltage and/or current measured values.

The recorded measured voltage values of the supply voltage and/or the measured current values of the supply current are subjected to an analysis process prior to being transmitted to the corresponding system component for power determination. In the data analysis, voltage characteristics of the voltage curve of the supply voltage and/or current characteristics of the current curve of the consumer current are determined.

The determined voltage quantities and/or current characteristics are subsequently transmitted to the system component which determines the power of the respective consumer taking into account the voltage quantities and/or current characteristics. Instead of the recorded voltage and/or current measured values, the voltage characteristics and/or current characteristics are thus transmitted, whereby a substantial reduction of the data volumes to be transmitted is achieved.

The voltage measured values or the current measured values are analyzed and the voltage characteristics or the current characteristics are determined depending on which of the voltage measured values or the voltage characteristics or the current measured values or the current characteristics are to be transmitted. If both voltage and current measured values are to be transmitted to the corresponding system component for determining the at least one power value, both the voltage measured values are analyzed and the voltage characteristics are determined and the current measured values are analyzed and the current characteristics are determined.

Only characteristic values from the voltage measuring device or from the at least one current measuring device are transmitted to the respective system component that performs the power determination. A transmission of voltage or current measured values does not take place.

The power is determined taking into account the voltage characteristics and/or current characteristics. For example, the characteristics may be embodied in such a way that a multiplication of the voltage characteristics and current characteristics leads to a corresponding power value.

A reverse transformation of the voltage and current characteristics into the corresponding voltage and current measured values is possible, as well. In this case, the power is determined taking into account the measured voltage and current values. The corresponding reverse transformation may be carried out by the system component serving for power determination after the voltage characteristic values and/or current characteristic values have been transmitted from the voltage measuring device and/or the at least one current measuring device to the corresponding power component.

The data volume of the voltage characteristics or current characteristics to be transmitted is considerably reduced to a data volume of the voltage measured values or the current measured values. Here, the characteristics are selected in such a way that the information content of the voltage characteristics or of the current characteristics corresponds to the information content of the measured voltage values or the measured current values. The information content may be restored at least by a reverse transformation of the voltage characteristics and/or of the current characteristics into the voltage and/or current measured values.

A curve, in particular of the supply voltage, which is also referred to as the voltage curve, or of the consumer current, which is also referred to as the current curve, is in the following a development over time of the supply voltage or of the consumer current and is determined by the respective measured voltage values or measured current values. The voltage curve or current curve may be represented by a suitable mathematical function or by a corresponding graph of the function.

In the following, an analysis function is a mathematical function that is used to analyze the voltage measured values and the current measured values and that is suitable for reproducing the voltage measured values and the current measured values and for describing the corresponding voltage characteristics of the supply voltage and current characteristics of the consumer current.

An analysis function in the present sense may also comprise a respective inverse function which returns the analysis process to the output. The prerequisite here, however, is that the inverse function enables an unambiguous assignment of the characteristic variable and the measured values to be analyzed, so that the inverse function unambiguously reproduces the measured values taking into account the characteristic variables.

In the following, characteristics are variables or parameters of the analysis function, which may transport an information content with regard to the courses of the respective measured values. For example, characteristics may be parameters of an adaptation function by which measured values are analyzed by adapting the adaptation function to the data to be analyzed via a variation of the characteristics, wherein the data to be analyzed may be formed by voltage and/or current measured values.

The characteristics may e.g. also be other quantities that are extracted from the measured values by the data analysis. The analysis function in such a case may be in the broadest sense an action instruction for carrying out the analysis and for extracting the characteristic quantities.

The characteristics thus convey an unambiguous information content with regard to the recorded measured values. Taking into account the respective analysis function, the parameters enable an unambiguous reproduction of the measured values and a description of the curve.

The characteristics and the analysis function are in a relation with regard to each other in that the characteristics are parameters of the analysis function. If the respective characteristics take the suitable values by the preceding analysis of the measured values, the respective measured values may be represented and reproduced by the analysis function under consideration of the characteristics.

According to an embodiment, the analysis of the voltage measured values of the supply voltage in the analysis step is performed by the voltage measurement device, wherein the analysis of the current measured values of the consumer current in the analysis step is performed by the at least one current measurement device.

This has the technical advantage that no measured values have to be transmitted to determine the power.

By analyzing the measured voltage values of the supply voltage in the voltage measuring device and/or the measured current values of the consumer current in the at least one current measuring device and by the associated generation of the corresponding voltage characteristics and/or current characteristics, it may be avoided that entire sets of recorded measured values of the supply voltage and/or the consumer current have to be transmitted to the respective system component to determine a corresponding power value.

Instead of the recorded measured values, only the determined characteristics are transmitted. By selecting the characteristics in such a way that the corresponding measured values may be reproduced taking into account the respective analysis function, the voltage characteristics and/or current characteristics convey an information content which may correspond to the information content of the measured values.

According to another embodiment, the analysis step of the voltage measured values and/or the current measured values comprises the method steps: performing a spectral analysis, in particular a discrete Fourier analysis, of the voltage measured values and/or the current measured values in a spectral analysis step, generating a voltage frequency spectrum of the supply voltage based on the spectral analysis of the voltage measured values and/or a current frequency spectrum of the consumer current based on the spectral analysis of the current measured values in a spectrum generating step, reducing the voltage frequency spectrum of the supply voltage and/or the current frequency spectrum of the consumer current to frequencies of a voltage fundamental frequency and of first n voltage harmonic frequencies of the supply voltage and/or to frequencies of a current fundamental frequency and of first n current harmonic frequencies of the consumer current in a reduction step, and identifying the voltage spectral values for frequencies of the voltage fundamental frequency and the first n voltage harmonics of the supply voltage as voltage characteristics and/or of the current spectral values for frequencies of the current fundamental frequency and the first n current harmonic frequencies of the consumer current as current characteristics in a spectral value identification step.

This has the technical advantage that the spectral analysis may be used to divide the supply voltage and/or the consumer current proportionally into in each case one fundamental frequency, wherein the basic frequency may be formed by a voltage fundamental frequency and/or a current fundamental frequency, and up to n harmonic frequencies, wherein the harmonics may be formed by a voltage harmonic frequency and/or a current harmonic frequency.

The spectral values of the supply voltage and/or of the consumer current determined via the discrete Fourier analysis for the respective fundamental frequency or the fundamental frequency and the first n harmonic frequencies represent the voltage and current characteristics. The corresponding Fourier series, in which the spectral values act as series parameters, serves as an analysis function by which the voltage and current measured values may be reproduced.

In addition to the advantage of reducing the data volume of the data packets to be transmitted by transmitting only corresponding characteristic values, the spectral values for the fundamental and harmonic frequencies, instead of transmitting the measured values, the advantage is achieved that by splitting the supply voltage and/or the consumer current into fundamental and harmonic frequencies, a detailed determination of different voltage values and/or current values is possible.

For example, in addition to the apparent power, the active power, the reactive power or the distortion reactive power may also be determined. This makes it possible to consider the influence of the harmonic frequencies. In this way, errors may be avoided, which would e.g. occur if the power were determined on the basis of effective values for current and voltage, in which the influence of harmonic frequencies would be neglected.

A fundamental frequency of a periodic signal is understood to be the relevant frequency of the signal over which the longest period of the periodic signal is determined. The fundamental frequency is the lowest frequency of the periodic components of the periodic signal. Harmonics, on the other hand, have frequency numbers that are integer multiples of the fundamental frequency. In the following, fundamental waves, fundamental oscillations and fundamental frequencies may be used synonymously. What is to be understood is a periodic component of a periodic voltage or current signal with the frequency of the fundamental frequency of the signal. The same applies to the terms harmonic waves, harmonic oscillation and harmonic frequency, which may also be used synonymously.

According to an embodiment, the spectral analysis step further comprises, determining at least one voltage DC component of the supply voltage and/or at least one current DC component of the consumer current, wherein in the spectral identification step the at least one voltage DC component is identified as a voltage characteristic and/or the at least one current DC component is identified as a current characteristic.

This provides the advantage of more precise spectral analysis.

According to an embodiment, the analysis step of the voltage measured values and/or the current measured values comprises the method steps: carrying out an adaptation process of an adaptation function to the voltage measured values and/or the current measured values in an adaptation step, determining voltage parameters of the adaptation function, the adaptation function with the voltage parameters describing the voltage characteristic of the supply voltage, and/or of current parameters of the adaptation function in a parameter determining step, the adaptation function with the current parameters describing the current curve of the consumer current, and identifying the voltage parameters of the adaptation function as voltage characteristics and/or the current parameters of the adaptation function as current characteristics in a parameter identification step.

This provides the technical advantage of providing a simple analysis of the supply voltage readings and/or the consumer current readings.

In the following, an adaptation function is a mathematical function which is suitable to be adapted to the respective measured values to be analyzed in an adaptation process by variation of corresponding parameters, so that the adapted function reproduces the corresponding measured values and describes a course of the measured values.

With the appropriately varied parameters, the adaptation function allows for a clear reproduction of the measured values and description of the course of the measured values. The adaptation function may be selected according to the requirements. For example, the most complex adaptation function possible with a high number of parameters to be varied may be selected in order to achieve the most exact fitting of the adaptation function to the measured values and the most precise result possible for the power to be determined.

However, for example, a comparatively simply embodied adaptation function with a comparatively smaller number of parameters may also be selected in order to achieve the fastest possible analysis that requires little processor power. The adaptation function may correspond to the analysis function.

According to an embodiment, the method further comprises the step of: synchronizing the voltage measuring device and the at least one current measuring device to a reference time in a synchronization step, wherein the voltage measuring device and the at least one current measuring device each determine a local time, and wherein the local time of the voltage measuring device and the local time of the at least one current measuring device are adjusted with respect to the reference time.

Hereby, it may be achieved that the measurements, wherein the measurements may be formed by voltage measured values and current measured values, of the supply voltage and the consumer current may be coordinated with each other. In this way, it may be ensured that in the case of distributed power determination, in which current and voltage are measured at different locations in the system, the respective measurements are carried out at coordinated times, and thus a meaningful result for the power determination may be achieved.

According to another embodiment, the synchronization of the voltage measuring device and the at least one current measuring device in the synchronization step comprises determining a phase shift between the voltage curve of the supply voltage and the current curve of the consumer current in a phase shift determination step.

This has the technical advantage that a synchronization of the respective measurements of supply voltage and consumer current is achieved by the determined phase shift.

According to an embodiment, the at least one power value is an active power, a reactive power, a distortion reactive power, or a total apparent power.

This has the technical advantage that a precise determination of the power is possible. Thus, a high information content may be achieved in each measurement by rendering various factors of the power accessible.

A system for distributed electrical power determination comprising a voltage source for providing a supply voltage is provided, at least one consumer connected to the voltage source via at least one voltage path, a voltage measuring device for measuring the supply voltage at a voltage measuring point on the voltage path, at least one current measuring device for measuring a supply current of the consumer at a current measuring point on the voltage path, a processor unit for generating at least one power value, and a control unit for controlling the voltage measuring device and the at least one current measuring device, the voltage measuring device being embodied to record voltage measured values of the supply voltage in order to determine a voltage curve of the supply voltage, analyzing the voltage measured values with an analysis function in order to determine voltage characteristics of the voltage curve of the supply voltage, generating a first data packet comprising the voltage characteristics, and transmitting the first data packet to the at least one processor unit, wherein the at least one current measurement device is embodied to record current measured values of the consumer current in order to determine a current characteristic of the consumer current, analyzing the current measured values with the analysis function in order to determine current characteristics of the current curve of the consumer current, generating a second data packet which comprises the current characteristics, and transmitting the second data packet to the at least one processor unit, and the at least one processor unit being embodied to determine at least one power value taking into account the voltage characteristics and/or the current characteristics.

This achieves the technical advantage of providing an efficient system for distributed power determination.

The voltage measurement device and the at least one current measurement device record voltage measured values for the supply voltage and current measured values for the consumer current at different locations in the system. This means that, especially in systems with a plurality of consumers, additional voltage measuring devices with the associated cabling may be saved, which are required for voltage and current measurement at one location for each of the consumers.

In the respective voltage and current measuring devices, the recorded measured values may be analyzed with respect to certain characteristics. The respective voltage and current characteristics may be arranged in first data packets and second data packets, wherein voltage characteristics are combined in first data packets and current characteristics in second data packets.

By generating the voltage characteristics and current characteristics and classifying the voltage characteristics and current characteristics into first data packets and second data packets, it is possible to avoid having to transmit entire sets of measured voltage values and measured current values to determine power.

The first data packets and/or second data packets may be transmitted from the voltage measuring device and/or from the at least one current measuring device to a processor unit in which a power determination may be carried out taking into account the voltage characteristics and/or current characteristics.

The processor unit is embodied to perform a determination of the respective power taking into account the voltage characteristics and/or current characteristics.

For this purpose, the processor unit may take into account the voltage characteristics and the current characteristics for power determination.

The processing unit may also perform an analysis with the analysis function of voltage measured values or current measured values that were not previously analyzed and not transmitted.

The processor unit may also perform a reverse transformation of voltage characteristics or current characteristics into the corresponding voltage measured values or current measured values. For this purpose, the processor unit uses the unique inverse function of the analysis function. In this case, the processor unit may consider the voltage measured values and the current measured values to determine the power.

According to one embodiment, the voltage measurement device, the at least one current measurement device and the processor unit are embodied to perform a spectral analysis, in particular a discrete Fourier analysis, of the voltage measured values and/or of the current measured values to generate a voltage frequency spectrum of the supply voltage on the basis of the spectral analysis of the voltage measured values and/or a current frequency spectrum of the consumer current on the basis of the spectral analysis of the current measured values, reducing the voltage frequency spectrum of the supply voltage and/or the current frequency spectrum of the consumer current to voltage spectral values of a fundamental voltage frequency and of first n voltage harmonics of the supply voltage and/or to current spectral values of a fundamental current frequency and of first n current harmonics of the consumer current, and to identify the voltage spectral values for frequencies of the voltage fundamental frequency and of the first n voltage harmonic frequencies of the supply voltage as voltage characteristics and/or the current spectral values for frequencies of the current fundamental frequency and of the first n current harmonic frequencies of the consumer current as current characteristics.

This has the technical advantage that the system may be used to perform a spectral analysis of the supply voltage and/or of the consumer current, and in this way the supply voltage and/or the consumer current may be divided up proportionally into a fundamental frequency and up to n harmonic frequencies in each case.

Spectral analysis, in addition to the advantage of reducing the data volume of the data packets to be transmitted by transmitting the spectral values for the fundamental and harmonic frequencies instead of the measured voltage values and/or measured current values, may be used to achieve a detailed determination of various voltage values and current values by splitting the supply voltage and/or the consumer current into fundamental and harmonic frequencies.

For example, in addition to the apparent power, the active power, the reactive power or the distortion reactive power may also be determined. This makes it possible to consider the influence of the harmonic frequencies of the supply voltage and of the consumer current. In this way, errors may be avoided, which would e.g. occur if the power were determined on the basis of effective values for current and voltage, in which the influence of harmonic frequencies is neglected.

According to an embodiment, the voltage measuring device, the at least one current measuring device and the processor unit are embodied to perform an adapting process of an adaptation function to the voltage measured values and/or the current measured values, to determine voltage parameters and/or current parameters of the adaptation function, and to identify the voltage parameters of the adaptation function as voltage characteristics and/or the current parameters of the adaptation function as current characteristics.

This provides the technical advantage of providing a simple analysis of the supply voltage measured values and/or the consumer current measured values.

According to another embodiment, the system further comprises at least one communication link between the voltage measurement device and the at least one processor unit and/or the at least one current measurement device and the at least one processor unit for transmitting the first data packet from the voltage measurement device to the at least one processor unit and/or the second data packet from the at least one current measurement device to the at least one processor unit.

This provides the technical advantage that the first and/or second data packets may be transmitted between the voltage measuring device, the at least one current measuring device and/or the one external process unit.

According to an embodiment, the at least one processor unit is formed in the voltage measuring device and/or in the at least one current measuring device, or is an external processor unit.

This ensures that the power determination may be carried out in the voltage measuring device, in the at least one current measuring device or in an external processor unit.

This provides the technical advantage of high flexibility. The power may be determined in the at least one current measuring device; for this purpose, the voltage characteristics must be transmitted from the voltage measuring device to the current measuring device.

Power may also be determined in the voltage measuring device. This in turn requires that the current characteristics are transmitted from the at least one current measuring device to the voltage measuring device.

When determining the power in the voltage measurement device or the at least one current measurement device, either the voltage characteristics and the current characteristics or the voltage measured values and the current measured values must be available.

In the case that only one data set had to be transmitted because the processor unit is formed in the voltage measuring device or the current measuring device, and thus only the voltage measured values or the current measured values were converted into the corresponding voltage characteristics or the current characteristics, corresponding voltage characteristics or current characteristics must be determined by the processor unit from the respective voltage measured values or current measured values not analyzed to date in order to determine the power.

Alternatively, reverse transformation of the voltage characteristics or current characteristics by the processor unit is also possible, so that the power determination may be performed on the basis of the voltage measured values and the current measured values.

The processor unit is embodied to generate the voltage and/or current characteristics from the measured voltage and/or current values. The processor unit is also embodied to perform a reverse transformation of the voltage characteristics and/or of the current characteristics into the corresponding voltage measured values and/or current measured values.

Alternatively, the power determination may also be carried out in an external processor unit. For this purpose, both the voltage characteristics from the voltage measuring device and the current characteristics from the at least one current measuring device have to be transmitted to the external processor unit.

According to an embodiment, the communication link of the system is a bus system in which information of the voltage measuring device and the at least one current measuring device may be read by the at least one current measuring device, or a centralized master-slave system in which the information of the voltage measuring device is sent to the at least one current measuring device via a central master.

This provides the technical advantage of reliable and fast data transmission.

According to a further embodiment, the voltage measuring device and the at least one current measuring device may be synchronized to each other, wherein the voltage measuring device and the at least one current measuring device each have a local individual time determination for this purpose, and wherein the local individual time determinations of the voltage measuring device and of the at least one current measuring device may be tuned to a global reference time of the system.

This ensures that despite the measurements of the supply voltage by the voltage measuring device and of the consumer current by the at least one current measuring device at different locations in the system, both measurements may be coordinated with each other in terms of time in order to achieve a meaningful result for the power determination on the basis of the measurement results for voltage and current of the voltage measuring device and the current measuring device.

According to another embodiment, the system includes a plurality of consumers each connected to the voltage source.

This provides the technical advantage of achieving distributed power determination for a plurality of consumers.

A computer program is provided comprising instructions that, when the computer program is executed by a computer or the control unit, cause the computer or the control unit to execute a method for distributed electrical power determination.

A machine-readable storage medium is provided, on which the computer program is stored.

BRIEF DESCRIPTION OF THE DRAWINGS

The present invention is explained in more detail below with reference to preferred embodiments, and drawings which show:

FIG. 7 is a schematic depiction of an Ethernet network structure having an Ethernet coupler and a voltage measuring device and at least one current measuring device, which are connected in a ring to the Ethernet coupler and which, according to an embodiment, process an Ethernet telegram when passing through;

DETAILED DESCRIPTION

Figure 1:
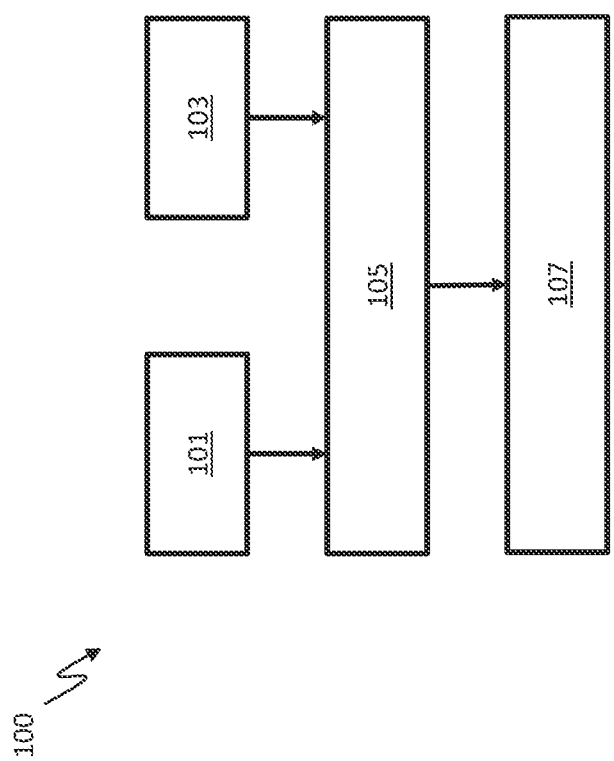
FIG. 1 is a flowchart of a method for distributed electrical power determination according to a first embodiment.
Figure 6:
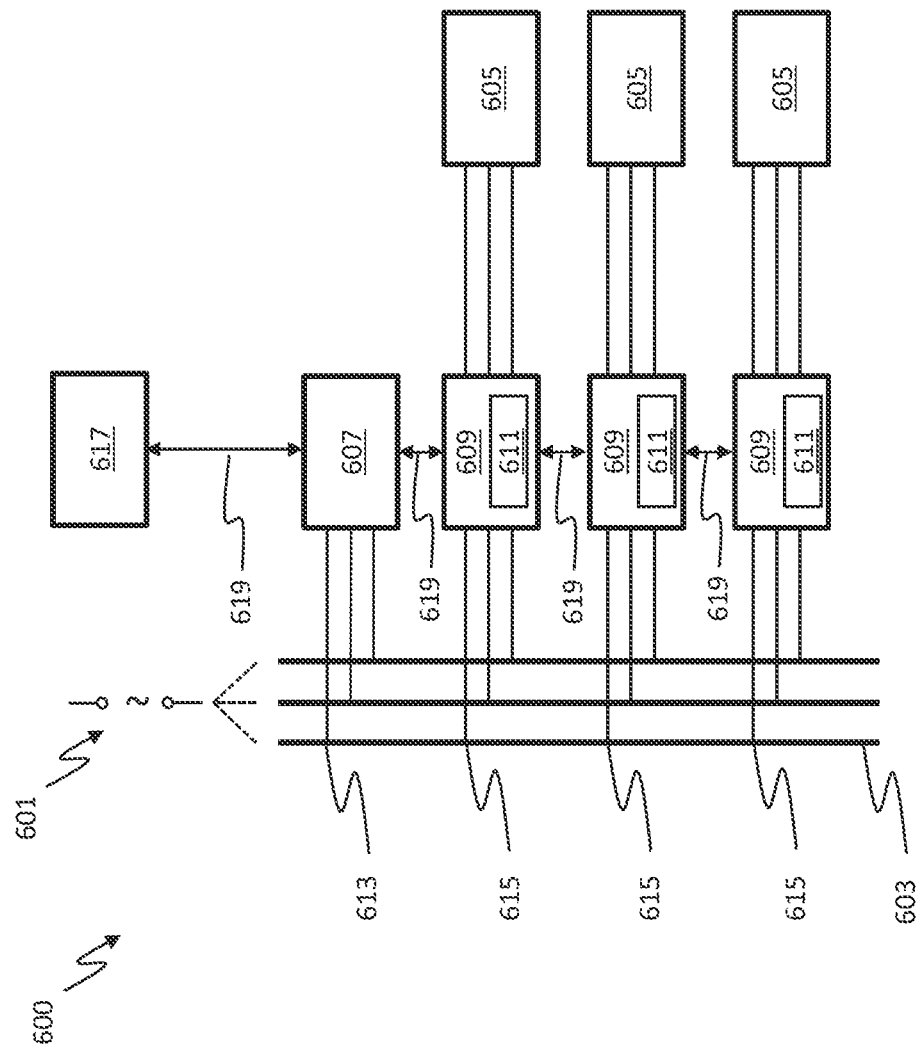
FIG. 6 is a schematic diagram of a system for distributed electrical power determination according to one embodiment.

FIG. 1 shows a flowchart of the method 100 for distributed electrical power determination of at least one consumer 605 shown in more detail in FIG. 6, according to a first embodiment. For better understanding, the method is always described in connection with the setup according to FIG. 6.

The consumer 605 is connected to a voltage source 601 via a voltage path 603. A voltage measuring device 607 determines a supply voltage U of the voltage source 601 at a voltage measuring point 613 on the voltage path 603 and at least one current measuring device 609 determines a consumer current I of the consumer 605 at a current measuring point 615 on the voltage path 603.

According to FIG. 1, the method 100 for distributed electrical power determination comprises the method steps: recording voltage measured values DPU of the supply voltage U by the voltage measurement device 607 for determining a voltage curve TCU of the supply voltage U in a voltage measurement step 101, recording current measured values DPI of a consumer current I of the at least one consumer 605 by the at least one current measurement device 609 to determine a current curve TCI of the consumer current I in a current measurement step 103, analyzing the voltage measured values DPU of the supply voltage U and/or the current measured values DPI of the consumer current I with an analysis function AF in an analysis step 105 to determine voltage characteristics AFPU of the voltage curve TCU of the supply voltage U and/or current characteristics AFPI of the current curve TCI of the consumer current I, and determining at least one power value L taking into account the voltage characteristics AFPU of the voltage curve TCU of the supply voltage U and/or the current characteristics AFPI of the current curve TCI of the consumer current I in a power value determination step 107.

For distributed determination of an electrical power of at least one electrical consumer 605, voltage measured values DPU of the supply voltage U of the consumer 605 are recorded by the voltage measurement device 607 in the voltage measurement step 101. Here, the voltage measurement device 607 records the voltage measured values DPU at a voltage measurement point 613.

In the current measurement step 103 which may be performed simultaneously in time with the voltage measurement step 101, current measured values DPI of the consumer current I of the at least one consumer 605 are recorded by the current measurement device 609 at a current measurement point 615 different from the voltage measurement point 613.

Thus, for distributed electrical power determination, voltage and current measurements are performed at two spatially separated measurement points.

Recording the voltage measured values DPU in the voltage measurement step 101 and recording the current measured values DPI in the current measurement step 103 by the voltage measurement device 607 and the current measurement device 609 may include recording a plurality of voltage measured values DPU in the voltage measurement step 101 and recording a plurality of current measured values DPI in the current measurement step 103. The recording of the measured values may take place continuously. However, it may also be limited to a predetermined measurement period. Preferably, the voltage measured values DPU and current measured values DPI are recorded during coordinated first time intervals T1 and second time intervals T2, with voltage measured values DPU being recorded in the first time intervals T1 and current measured values DPI being recorded in the second time intervals T2.

By recording the voltage measured values DPU in voltage measurement step 101 and current measured values DPI in current measurement step 103, voltage curves TCU of the supply voltage U and current curves TCI of the consumer current I may be generated. The voltage curves TCU and current curves TCI in this context describe the development of the supply voltage U and the consumer current I over time and are defined by the respective measured voltage values DPU and measured current values DPI. The voltage curves TCU and current curves TCI may be described by an appropriately selected analysis function AF.

After recording the voltage measured values DPU in the voltage measurement step 101 and after recording the current measured values DPI in the current measurement step 103, the voltage measured values DPU and/or the current measured values DPI are subjected to data analysis in the analysis step 105. Either the voltage measured values DPU or the current measured values DPI may be analyzed. Alternatively, the voltage measured values DPU and the current measured values DPI may be analyzed. Which of the two sets of data are analyzed may depend on which of the voltage measured values DPU and the current measured values DPI are to be transmitted to a processing unit 611 for determining at least one line value L in the further course of the method 100.

Voltage measured values DPU or current measured values DPI to be transmitted from voltage measurement device 607 or from current measurement device 609 for power determination may be analyzed in analysis step 105. Non-analyzed voltage measured values DPU or current measured values DPI are not transmitted.

The voltage measured values DPU are analyzed by the voltage measurement device 607 in the analysis step 105, while the current measured values DPI are analyzed by the current measurement device 609 in the analysis step 105.

The analysis of the voltage measured values DPU and/or of the current measured values DPI comprises an analysis of the respective measured values with a selected analysis function AF in the analysis step 105. An analysis function AF is in this context a mathematical function or a mathematical action rule which is suitable for determining voltage characteristics AFPU and current characteristics AFPI of the voltage curves TCU and of the current curves TCI from the voltage measured values DPU and/or the current measured values DPI.

Voltage characteristics AFPU and current characteristics AFPI may e.g. be parameters of the analysis function AF which are varied accordingly during the analysis in order to approximate the analysis function AF to the voltage measured values DPU and/or to the current measured values DPI. Such parameters are thus suitable for unambiguously characterizing the voltage curves TCU and the current curves TCI of the respective measured voltage values DPU and the measured current values DPI, taking into account the respective analysis function AF.

The analysis function AF is identical for the analysis of the voltage measured values DPU and the current measured values DPI. Also, the parameters of the AF analysis function, which are varied during the analysis process, are identical for both analyses of the DPU voltage measured values and of the DPI current measured values.

The voltage characteristics AFPU and current characteristics AFPI obtained by the respective analyses in analysis step 105 are merely different numerical values of the same parameters.

The choice of parameters may depend on the choice of the analysis function AF.

However, the voltage characteristics AFPU and current characteristics AFPI are not limited to parameters of the analysis function AF. Alternatively, the voltage parameters AFPU and current parameters AFPI may also be determined from other parameters which may be determined by applying the analysis function AF to the measured voltage values DPU and/or measured current values DPI. However, it is a prerequisite that the respective voltage measured values DPU and current measured values DPI may be recovered from the voltage characteristic quantities AFPU and current characteristic quantities AFPI in an unambiguous manner. This may require that the respective action rule expressed by the analysis function AF is unambiguously reversible.

The number and technical importance of voltage characteristics AFPU and current characteristics AFPI are directly related to the choice of analysis function AF and may vary greatly between different analysis functions AF.

After analysis of the voltage measured values DPU and/or the current measured values DPI in the analysis step 105, at least one power value L is determined in the power value determination step 107, taking into account the voltage characteristic values AFPU and/or current characteristic values AFPI generated in the analysis step 105.

For this purpose, at least the voltage characteristics AFPU from the voltage measuring device 607 or the current characteristics AFPI from the current measuring device 609 are transmitted to a processor unit 611, by which the power determination is carried out in accordance with the power value determination step 107.

Preferably, the analysis step 105 analyzes those measured values, namely the voltage measured values DPU or the current measured values DPI or both, that are to be transmitted to the processor unit 611.

The processor unit 611 may be embodied in the voltage measurement device 607. In this case, the current measured values DPI are analyzed in the analysis step 105 and current characteristics AFPI are determined to be transmitted from the current measurement device 609 to the voltage measurement device 607 and the processor unit 611 embodied therein.

However, the processor unit 611 may also be formed in the at least one current measuring device 609. In this case, the voltage measured values DPU are analyzed in the analysis step 105 and the voltage characteristics AFPU are determined in order to then transmit them from the voltage measurement device 607 to the current measurement device 609 and the processor unit 611 formed therein.

Alternatively, however, the processing unit 611 may also be an external processing unit 611 that is not embodied in either the voltage measurement device 607 or the current measurement device 609. In this case, both the voltage measured values DPU and the current measured values DPI are analyzed in the analysis step 105 and the voltage characteristics AFPU and the current characteristics AFPI are determined accordingly, and both the voltage characteristics AFPU and the current characteristics AFPI are transmitted to the external processor unit 611.

In the power value determination step 107, at least one power value L is determined taking into account the voltage characteristics AFPU and/or current characteristics AFPI.

In case the processor unit 611 is embodied in the voltage measuring device 607 or in the current measuring device 609 and only the voltage measured values DPU or the current measured values DPI have been analyzed in the analysis step 105 and the corresponding voltage characteristics AFPU or current characteristics AFPI have been determined and transmitted to the processor unit 611, in order to determine the at least one power value L in the power value determination step 107 in the processor unit 611, the respective non-analyzed voltage measured values DPU or current measured values DPI may be analyzed with the analysis function AF and the corresponding voltage characteristics AFPU or current characteristics AFPI may be determined.

For example, if the processor unit 611 is embodied in the voltage measurement device 607 and the current measured values DPI have been analyzed and the current characteristics AFPI have been determined in the analysis step 105 to be transmitted from the current measurement device 609 to the voltage measurement device 607 and the processor unit 611 embodied therein, the voltage measured values DPU may be analyzed and the voltage characteristics AFPU may be determined in the power value determination step 107.

In case the processor unit 611 is embodied in the current measurement device 609 and the voltage measured values DPU have been analyzed and the voltage characteristics AFPU have been determined in the analysis step 105, the current measured values DPI may be analyzed and the current characteristics AFPI may be determined analogously in the power value determination step 107.

Determining the at least one power value L by the processing unit 611 is then carried out based on the voltage characteristics AFPU and the current characteristics AFPI in the power value determination step 107.

For this purpose, e.g. the voltage characteristics AFPU and the current characteristics AFPI may be multiplied with each other. However, the way of determining the at least one power value L may depend on the choice of the voltage characteristics AFPU and the current characteristics AFPI.

Alternatively, reverse transformation of the transmitted voltage characteristics AFPU or current characteristics AFPI into the corresponding voltage measured values DPU or current measured values DPI may be carried out by the processor unit 611.

For example, if the processor unit 611 is formed in the current measurement device 609 and, consequently, the voltage measured values DPU were analyzed in the analysis step 105 and the voltage characteristics AFPU were determined and transmitted to the processor unit 611 while the current measured values DPI were not analyzed in the analysis step 105, the voltage characteristics AFPU may be transformed back into the voltage measured values DPU by the processor unit 611 in the power value determination step 107.

Determining the at least one power value L then takes place on the basis of the voltage measured values DPU and the current measured values DPI.

A reverse transformation of voltage characteristics AFPU or current characteristics AFPI into corresponding voltage measured values DPU or current measured values DPI may e.g. be carried out by applying an inverse function of the analysis function AF or by an inverse action rule of the mathematical action rule determined by the analysis function AF to the respective voltage characteristics AFPU or current characteristics AFPI.

In case the processor unit 611 is configured as an external processor unit 611, the processor unit 611 preferably has the voltage characteristics AFPU and current characteristics AFPI, since these have been determined from the corresponding voltage measured values DPU and current measured values DPI for transmission from the voltage measurement device 607 and the current measurement device 609, respectively, to the processor unit 611 in the analysis step 105.

Determining the at least one power value L may thus be performed on the basis of the transmitted voltage characteristics AFPU and the current characteristics AFPI.

Alternatively, the voltage characteristics AFPU and current characteristics AFPI may be transformed back into the corresponding voltage measured values DPU and into the current measured values DPI and the determination of the at least one power value L may be carried out on the basis of the voltage measured values DPU and current measured values DPI.

Figure 2:
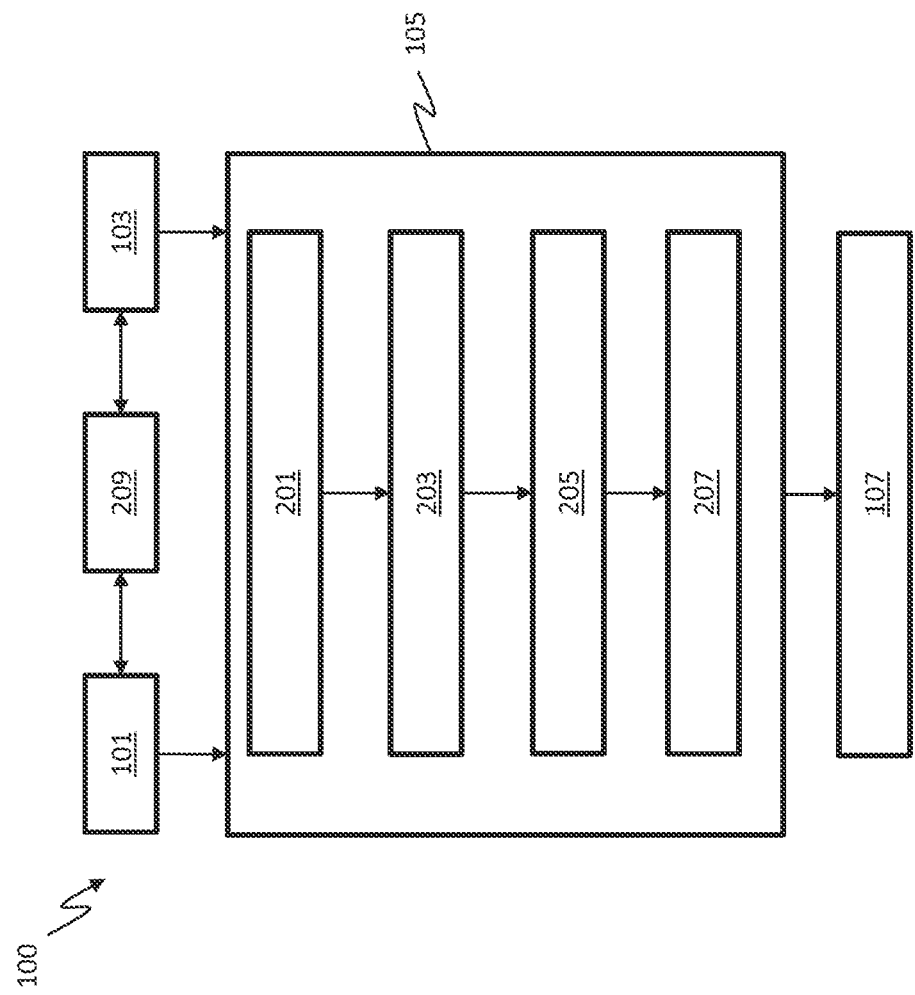
FIG. 2 is a flowchart of the method for distributed electrical power determination according to a further embodiment.

FIG. 2 shows a flowchart of the method 100 for distributed electrical power determination according to another embodiment.

Unless otherwise described, the method 100 in FIG. 2 includes the steps described in FIG. 1.

According to FIG. 2, the voltage measurement device 607 and the current measurement device 609 are synchronized to a reference time in a synchronization step 209.

The object of synchronizing the voltage measurement device 607 and the at least one current measurement device 609 in the synchronization step 209 is to synchronize the recording of the voltage measured values DPU by the voltage measurement device 607 in the voltage measurement step 101 and the recording of the current measured values DPI by the current measurement device 609 in the current measurement step 103. In this way, it may be ensured that the voltage measured values DPU and current measured values DPI recorded at different voltage measurement points 613 and current measurement points 615 may be used for determining the at least one power value L and a meaningful result may be obtained.

For synchronization according to the synchronization step 209, the voltage measurement device 607 and the current measurement device 609 may each have an individual local time determination. For example, the voltage measurement device 607 and the at least one current measurement device 609 may each have their own independent local clock that provides individual independent time determination for the respective measurement device.

The local clocks of the voltage measuring device 607 and the current measuring device 609 may then be set in relation to a global reference clock independent of the local clocks for synchronization according to the synchronization step 209 by determining the deviations of the local clocks from the global reference clock, respectively.

Alternatively, one of the local clocks of the voltage measuring device 607 and the current measuring device 609 may be determined as the global clock. In this case, synchronization according to synchronization step 209 is performed analogously by setting the local times of the local clocks in relation to the reference time of the reference clock.

For this purpose, time signals may e.g. be sent from the reference clock to the local clocks, by which the local clocks may set the locally determined time in relation to the reference time.

According to FIG. 2, analyzing the voltage readings DPU and/or the current readings DPI in the analysis step 105 comprises performing a spectral analysis in a spectral analysis step 201.

The spectral analysis of the voltage measured values DPU and/or of the current measured values DPI in the spectral analysis step 201 is realized in particular by a Fourier analysis and a discrete Fourier transform, respectively.

The Fourier analysis, in particular the discrete Fourier transform, of the measured voltage values DPU and/or of the measured current values DPI enables the supply voltage U represented by the measured voltage values DPU and/or the consumer current I represented by the measured current values DPI to be decomposed into periodic components of the supply voltage U and the consumer current I with fundamental frequencies and harmonic frequencies.

Furthermore, the Fourier analysis, in particular the discrete Fourier transform, allows a determination of the respective periodic components with voltage fundamental frequency U0, current fundamental frequencies I0, voltage harmonics $U_1, \ldots, U_n$, and current harmonics $I_1, \ldots, I_n$ of the supply voltage U to be analyzed and/or the consumer current I to be analyzed.

For this purpose, voltage spectral values $SDU_0$ and/or current spectral values $SDI_0$ of the voltage fundamental frequency $U_0$ and/or the current fundamental frequency $I_0$ and voltage spectral values $SDU_1, \ldots, SDU_n$ and current spectral values $SDI_1, \ldots, SDI_n$ of the voltage harmonics $U_1, \ldots, U_n$, and the current harmonics $I1, \ldots, I_n$ as well as the voltage DC component $SDU_{n+1}$ of the supply voltage U and the current DC component $SDI_{n+1}$ of the consumer current I may be determined.

The voltage spectral values $SDU_0, SDU_1, \ldots, SDU_n$, and the voltage DC component $SDU_{n+1}$ and the current spectral values $SDI_0, SDI_1, \ldots, SDI_n$, and the current DC component $SDI_{n+1}$ are in this context numerical values of the proportional distribution of the respective periodic components of the periodic supply voltage U including the voltage DC component and the periodic consumer current I including the current DC component.

Furthermore, voltage phase angles $\Phi_{U1}, \ldots \Phi_{Un}$ of the voltage harmonics $U_1, \ldots, U_n$, and current phase angles $\Phi_{I1}, \ldots \Phi_{In}$ of the current harmonics $I_1, \ldots, I_n$ may be determined in relation to the voltage fundamental frequency $U_0$ and the current fundamental frequency $I_0$.

For a more detailed description for performing of a Fourier analysis or a discrete Fourier transform, reference is made to the corresponding description in the prior art.

In the embodiment described, the action rule of the discrete Fourier transform may e.g. be the analysis function AF.

In a spectrum generation step 203, a voltage frequency spectrum SDU of the supply voltage U and/or a current frequency spectrum SDI of the consumer current I is generated as a result of the spectral analysis or Fourier analysis of the voltage measured values DPU and/or the current measured values DPI.

In the respective voltage frequency spectrum SDU of the supply voltage U or the current frequency spectrum SDI of the consumer current I, the proportional composition of the supply voltage U or the consumer current I from periodic components of different frequencies is shown.

The supply voltage U or the consumer current I may be represented by a linear combination of sine or cosine functions of the frequencies determined in the respective voltage frequency spectrum SDU or current frequency spectrum SDI, wherein the components of the respective frequencies represented in the voltage frequency spectrum SDU or current frequency spectrum SDI serve as factors of the sine or cosine functions with the respective frequency.

In a Fourier analysis, such a linear combination is represented by a corresponding Fourier series.

In a reduction step 205, the voltage frequency spectrum SDU of the supply voltage U and/or the current frequency spectrum SDI of the consumer current I is reduced to the frequencies of a voltage fundamental frequency $U_0$ and/or current fundamental frequency $I_0$ and the first n voltage harmonic frequencies $U_1, \ldots, U_n$ and/or the first n current harmonic frequencies $I_1, \ldots, I_n$. In addition, the voltage DC component $SDU_{n+1}$ and/or the current DC component $SDI_{n+1}$ are determined.

The voltage DC component $SDU_{n+1}$ and the current DC component $SDI_{n+1}$ here represent the arithmetic mean of the periodic supply voltage U and of the periodic consumer current I.

The fundamental voltage frequency $U_0$, the fundamental current frequency $I_0$, the first n voltage harmonics $U1, \ldots, U_n$ and the first n current harmonics $I_1, \ldots, I_n$ represent the proportionally dominant components of the voltage frequency spectrum SDU of the supply voltage U and of the current frequency spectrum SDI of the consumer current I. Components with other frequencies, however, may be neglected.

The components of the fundamental voltage frequency $U_0$, the fundamental current frequency $I_0$, the first n voltage harmonic frequencies $U1, \ldots, U_n$ and the first n current harmonic frequencies $I_1, \ldots, I_n$ and the voltage DC component $SDU_{n+1}$ and the current DC component $SDI_{n+1}$ are thus sufficient in a linear combination as described above to describe the voltage curve TCU of the supply voltage U or the current curve TCI of the consumer current I.

Furthermore, voltage phase angles $\Phi_{U1}, \ldots \Phi U_n$ of the first n harmonics with the determined voltage harmonics $U1, \ldots, U_n$ to the fundamental with the voltage fundamental frequency U0 of the supply voltage U and/or corresponding current phase angles $\Phi I1, \ldots \Phi_{In}$ of the first n harmonics with the determined current harmonics $I1, \ldots, I_n$ to the fundamental with the current fundamental frequency I0 of the consumer current I are determined.

In a spectral value identification step 207, the voltage spectral values $SDU_0$ of the voltage fundamental frequency $U_0$, the voltage spectral values $SDU_1, \ldots, SDU_n$ of the first n voltage harmonics $U_1, \ldots, U_n$ and the corresponding voltage phase angles $\Phi_{U1}, \ldots, \Phi_{Un}$ of the supply voltage U as voltage characteristics AFPU and the current spectral values $SDI_0$ of the fundamental current frequency $I_0$, the current spectral values $SDI_1, \ldots, SDI_n$ of the first n current harmonics $I_1, \ldots, I_n$ and the corresponding current phase angles $\Phi_{I1}, \Phi_{In}$ of the consumer current I as current characteristics AFPI are identified.

In addition, the voltage DC component $SDU_{n+1}$ is identified as another voltage parameter AFPU and the current DC component $SDI_{n+1}$ is identified as another current parameter AFPI.

With the above-described linear combinations of sine or cosine functions of the fundamental voltage frequency U0 and the first n voltage harmonic frequencies $U1, \ldots, U_n$ and the voltage DC component $SDU_{n+1}$, or of the fundamental current frequency $I_0$ and the first n current harmonic frequencies $I_1, \ldots, I_n$ and the current DC component $SDI_{n+1}$, respectively, the voltage curve TCU of the supply voltage U and the current curve TCI of the consumer current I may be reproduced by the corresponding voltage spectral values $SDU_0, \ldots, SDU_n$ for the fundamental voltage frequency $U_0$ and the voltage harmonic frequencies $U_1, \ldots, U_n$ and with the voltage DC component $SDU_{n+1}$ as well as with the current spectral values $SDI_0, SDI_n$ for the fundamental current frequency $I_0$ and the current harmonic frequencies $I_1, \ldots, I_n$ and with the current DC component $SDI_{n+1}$ as factors of the linear combinations.

The number of voltage harmonics $U_1, \ldots, U_n$ or current harmonics $I_1, \ldots, I_n$ which are taken into account during the analysis of the supply voltage U or the consumer current I, is variable and may be selected as required. A higher number of considered harmonic frequencies may lead to a higher accuracy of the analysis.

After identifying the voltage spectral values $SDU_0$ for the fundamental voltage frequency $U_0$ and the voltage spectral values $SDU_1, \ldots, SDU_n$ for the first n voltage harmonic frequencies $U_1, \ldots, U_n$ and the voltage DC component $SDU_{n+1}$ as voltage characteristics AFPU and/or identifying the current spectral values $SDI_0$ for the fundamental current frequency $I_0$ and the current spectral values $SDI1, \ldots, SDI_n$ for the first n current harmonics $I_1, \ldots, I_n$ and the current DC component $SDI_{n+1}$ as current characteristics AFPI, these characteristics are used in the power value determination step 107 to determine the at least one power value L.

Depending on which of the voltage measured values DPU or the current measured values DPI have been analyzed by the spectral analysis in the spectral analysis step 201, the determination of the at least one power value L according to the power value determination step 107 provides for a further analysis of the respective voltage measured values DPU or current measured values DPI not analyzed until then by the spectral analysis described above carried out by the processor unit 611 in the spectral analysis step 201.

After the voltage characteristics AFPU or current characteristics AFPI have been successfully determined by analyzing the previously unanalyzed voltage measured values DPU or current measured values DPI, the at least one power value L may be determined on the basis of the voltage characteristics AFPU and current characteristics AFPI.

If, for example, the voltage measured values DPU are analyzed and the voltage characteristics AFPU are determined in the analysis step 105, but the current measured values DPI are not analyzed, the current measured values DPI are analyzed and the current characteristics AFPI are determined in the following power value determination step 107 by the processing unit.

If the current measured values DPI are analyzed in analysis step 105 and the current characteristics AFPI are determined, but the voltage measured values DPU are not analyzed, it is to be proceeded accordingly.

If both the voltage measurements DPU and the current measurements DPI have been analyzed in the analysis step 105 and the voltage characteristics AFPU and the current characteristics AFPI have been determined, in the power value determination step 107.

The voltage characteristics AFPU and the current characteristics AFPI are used to determine the at least one power value L.

For this purpose, for example, the voltage characteristics AFPU, in particular the voltage spectral values $SDU_0, \ldots, SDU_n$ for the fundamental voltage frequency $U_0$ and the voltage harmonic frequencies $U_1, \ldots, U_n$ and the voltage DC component $SDU_{n+1}$ may be combined to form a voltage vector U, which comprises the voltage spectral values of the voltage fundamental frequency U0 and the first n voltage harmonics $U_1, \ldots, U_n$ and the voltage DC component $SDU_{n+1}$ of the supply voltage U, wherein the index T denotes the transposed vector.

$$U = [SDU_0, SDU_1, \ldots, SDU_n, SDU_{n+1}]^T$$

Analogously, the current characteristics AFPI, in particular the current spectral values $SDI_0, \ldots, SDI_n$ of the fundamental current frequency $I_0$ and current harmonic frequencies $I_1, \ldots, In$ and the current DC component $SDI_{n+1}$ may be combined to form a current vector I comprising the current spectral values of the fundamental current frequency I0 and the first n current harmonic frequencies $I_1, \ldots, I_n$ and the current DC component $SDI_{n+1}$ of the consumer current I.

$$I = [SDI_0, SDI_1, \ldots, SDI_n, SDI_{n+1}]^T$$

From the two voltage vectors U and current vector I, a matrix S of the apparent power S may in the following be generated, where I* denotes the complex conjugate current vector I of the current characteristics AFPI or, respectively, of the harmonics, i.e. the fundamental current frequency $I_0$ and the first n current harmonic frequencies $I_1, \ldots, In$ of the supply current I.

$$\underline{S} = U \times I^* = \begin{bmatrix} SDU_0 \cdot SDI_0^* & \ldots & SDU_0 \cdot SDI_{n+1}^* \\ \vdots & \ddots & \vdots \\ SDU_{n+1} \cdot SDI_0^* & \ldots & SDU_{n+1} \cdot SDI_{n+1}^* \end{bmatrix}$$

From this, both the active power P, the reactive power Q and the distortion reactive power D may be determined.

The active power P results from summation of the real parts of the diagonal of the matrix S of the apparent power, for which the matrix entries $SDU_i \cdot SDI_j^*$ have identical indices i and j, wherein i and j describe the row and column entries of the matrix S, so that the following applies $$\Re\{SDU_i \cdot SDI_i^*\}, \forall i \leq n+1$$

$$P = \sum_{i=0}^{n+1} \Re\{SDU_i \cdot SDI_i^*\}$$

The analogous summation of the imaginary parts of the diagonal entries with identical indices for $SDU_i \cdot SDI_j^*$ results in the reactive power Q.

$$Q = \sum_{i=0}^{n+1} \Im\{SDU_i \cdot SDI_i^*\}$$

The distortion reactive power D, on the other hand, is obtained by summing all other matrix entries for which the indices for $SDU_i \cdot SDI_j^*$ are different.

$$D = \sqrt{\sum_{i \neq j; i,j \leq n+1} SDU_i \cdot SDI_j^*}$$

The total apparent power S is obtained by summing the squares of the active power P, the reactive power Q and the distortion reactive power D.

$$S = \sqrt{P^2 + Q^2 + D^2}$$

Consequently, the analysis of the measured voltage values DPU and the measured current values DPI on the basis of a spectral analysis, in particular a discrete Fourier transform, allows for determining different components of the total apparent power S.

Alternatively, in the power value determination step 107, it is also possible to back-transform the voltage characteristics AFPU and current characteristics AFPI into the corresponding voltage measured values DPU and current measured values DPI.

Such a reverse transformation may e.g. be achieved by performing a corresponding Fourier reverse transformation of the determined voltage spectral values $SDU_0, \ldots, SDU_n$ for the fundamental frequency $U_0$ and the harmonics $U_1, \ldots, U_n$ of the supply voltage U or of the current spectral values $SDI_0, \ldots, SDI_n$ for the fundamental frequency $I_0$ and the harmonics $I_1, \ldots, I_n$ of the consumer current I into the corresponding measured voltage values DPU or measured current values DPI. If measured voltage values DPU or measured current values DPI have not been analyzed in analysis step 105, they remain unchanged.

It is then possible to determine the at least one power value L by taking into account the voltage measured values DPU and the current measured values DPI thus obtained in the power determination step 107, for example by multiplying individual voltage measured values DPU and current measured values DPI.

In one embodiment, the discrete Fourier transform may be performed as a fast Fourier transform.

Figure 3:
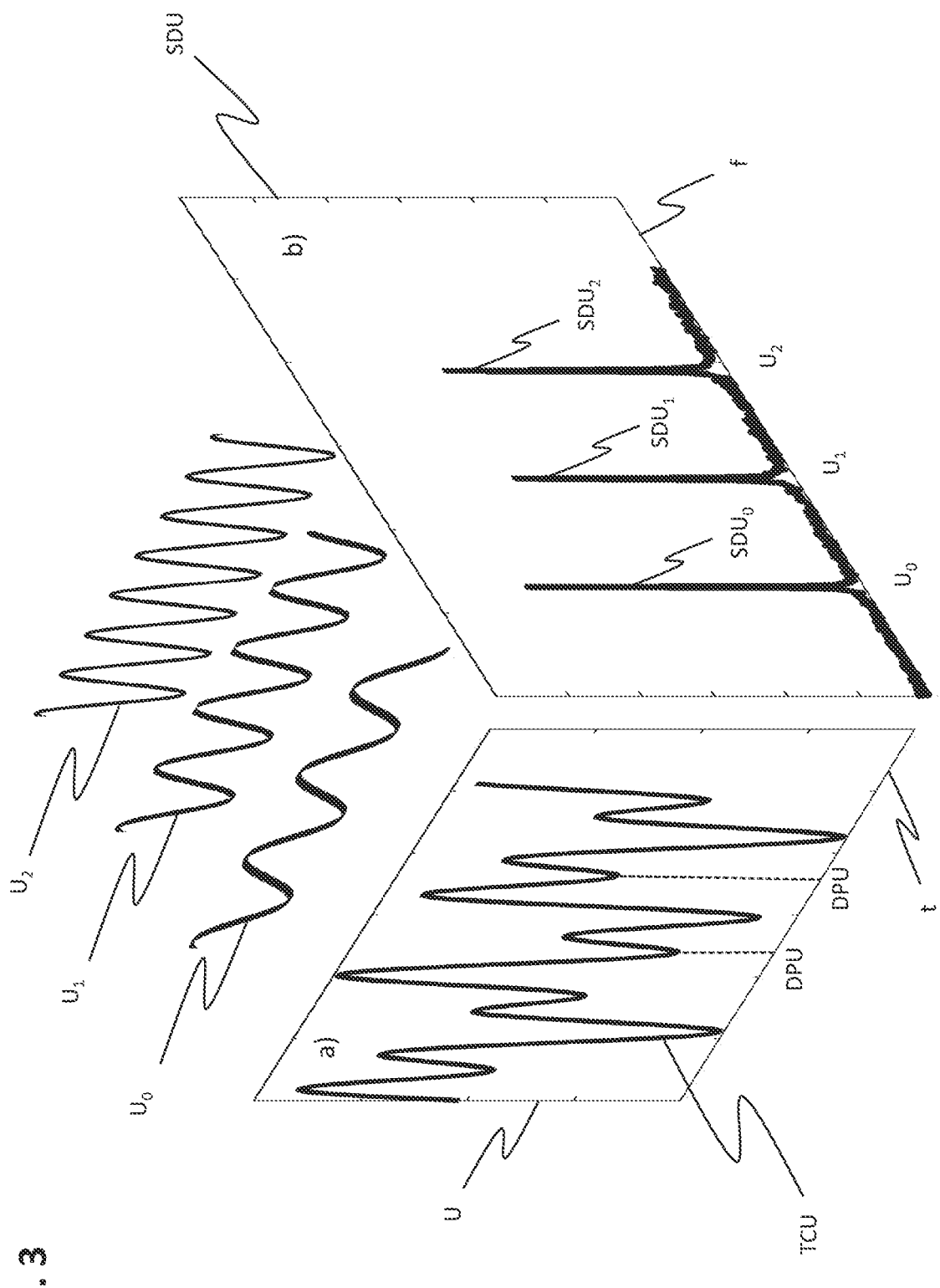
FIG. 3 is a schematic depiction of a spectral analysis of the distributed electrical power determination method according to a further embodiment.

FIG. 3 shows a schematic diagram of a spectral analysis of the method 100 for distributed electrical power determination according to a further embodiment.

Considering FIG. 3, the procedure of the spectral analysis explained above is again described in illustrative form.

For reasons of clarity, FIG. 3 is limited to the supply voltage U. However, what is shown in FIG. 3 may be applied analogously to the consumer current I.

In the supply voltage U vs. time t diagram, which may also be referred to as diagram a), a time voltage curve TCU of the supply voltage U is shown. However, the curve shown in diagram a) is for illustrative purposes only and is not intended to represent a real time voltage curve TCU of a supply voltage U.

The voltage curve TCU shows the periodic curve of a fundamental oscillation with fundamental voltage frequency $U_0$, which is, however, superimposed by harmonics with harmonic frequencies $U_1, \ldots, U_n$ and distorted accordingly. The supply voltage U shown thus results from a superposition of a periodic voltage signal of the fundamental voltage frequency U0 and various voltage signals of the voltage harmonic frequencies $U_1, \ldots, U_n$ and the voltage DC component $SDU_{n+1}$.

With the spectral analysis according to the spectral analysis step 201, the individual periodic voltage signals may be separated according to frequencies.

This is shown for the fundamental voltage frequency $U_0$, the first voltage harmonic frequency $U_1$ and the second voltage harmonic frequency $U_2$ with the three sine functions of different frequency. The sine functions shown here are only illustrative and do not describe any real fundamental and harmonic oscillations of a supply voltage U.

In diagram b), in which voltage spectral values $SDU_0, \ldots, SDU_n$ for the fundamental frequency $U_0$ and harmonics $U_1, \ldots, U_n$ of the supply voltage U are plotted against the frequency f, the corresponding voltage frequency spectrum SDU of the voltage curve TCU of the supply voltage U shown in diagram a) is shown.

The individual components of the supply voltage U are plotted in diagram b) in proportion to their respective frequencies. The three voltage spectral values $SDU_0$, $SDU_1$, $SDU_2$ shown as peaks in diagram b) correspond to the three sinusoidal functions with the voltage fundamental frequency $U_0$ and the voltage harmonics $U_1$, $U_2$. The height of the respective peaks numerically represents the proportion that the respective fundamental and harmonics represent in the voltage curve TCU shown in diagram a). With respect to the three sinusoidal functions shown, the heights of the peaks, i.e. the numerical values of the voltage spectral values $SDU_0$, $SDU_1$, $SDU_2$ correspond to the amplitudes of the corresponding sinusoidal functions.

The voltage DC component $SDU_{n+1}$ corresponds in this respect to a constant offset of the supply voltage U with respect to the Y axis.

When reducing the voltage frequency spectrum SDU of the supply voltage U to the fundamental voltage frequency U0 and the voltage harmonic frequencies $U_1, \ldots, U_n$ according to reduction step 205, only the voltage spectral values $SDU_0$, $SDU_1$, $SDU_n$ of the fundamental and voltage harmonic frequencies $U_0, U_1, \ldots, U_n$ are taken into account from a voltage frequency spectrum SDU comparable to that in diagram b).

When identifying the voltage spectral values $SDU_0$, $SDU_1, \ldots, SDU_n$ of the fundamental voltage frequency $U_0$ and the voltage harmonic frequencies $U_1, \ldots, U_n$ as voltage characteristics AFPU according to the spectral value identification step 207, the voltage characteristics AFPU comprise n+1 number pairs consisting of a frequency value of the respective fundamental voltage frequency $U_0$ or upper voltage frequency $U_1, \ldots, U_n$ and a number value which comprises the portion of the corresponding frequency in the voltage curve TCU of the supply voltage U, i.e. the respective voltage spectral value $SDU_0$, $SDU_1, \ldots, SDU_n$. Furthermore, the voltage characteristics AFPU may comprise at least one additional value for the voltage DC component $SDU_{n+1}$.

Figure 4:
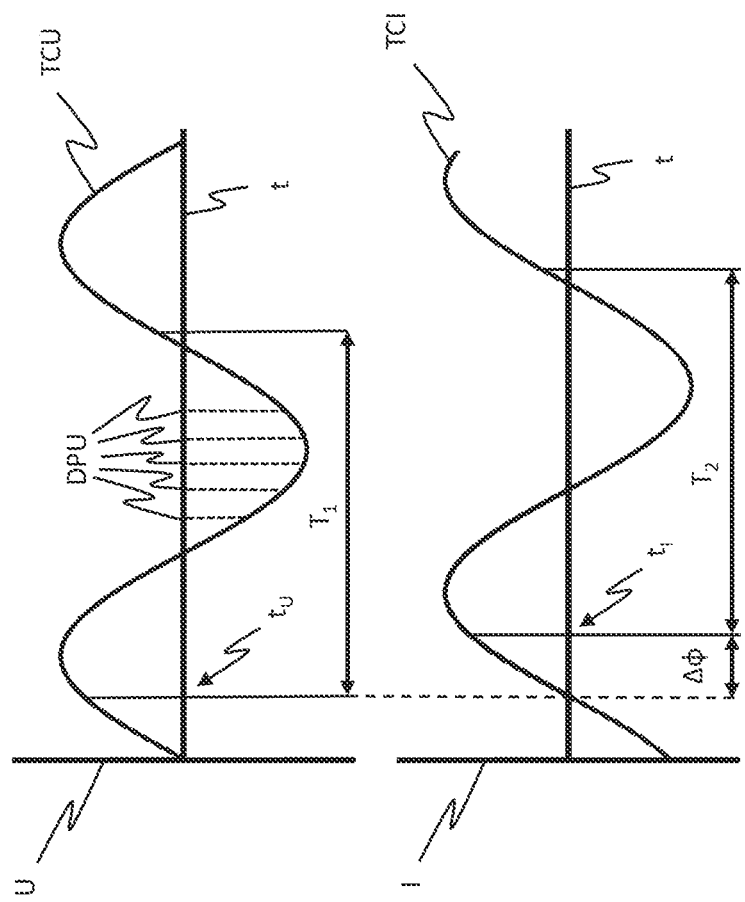
FIG. 4 is a schematic depiction of a supply voltage and of a consumer current of the method for distributed electrical power determination according to a further embodiment.

FIG. 4 shows a schematic illustration of a supply voltage U and a consumer current I of the method 100 for distributed electrical power determination according to a further embodiment.

Shown are a voltage-time diagram, in which a voltage curve TCU of a supply voltage U is shown over time, and a current-time diagram, in which a current curve TCI of a consumer current I is shown over time.

Both the supply voltage U and the consumer current I are shown as pure sinusoidal voltage and pure sinusoidal current to simplify the illustration. In reality, of course, both the supply voltage U and the consumer current I may deviate significantly from a pure sine voltage or a pure sine current.

Furthermore, a first time interval $T_1$ with a first start time $t_U$ is indicated in the voltage-time diagram. This first time interval $T_1$ identifies the time period over which voltage measured values DPU of the supply voltage U are recorded by the voltage measurement device 607 in the voltage measurement step 101. These voltage measured values DPU are exemplarily represented in the voltage-time diagram by five measured voltage values DPU. However, a high number of voltage measured values DPU may be recorded over the entire first time interval $T_1$.

The current-time diagram has an analogous second time interval $T_2$ with a second start time $t_1$, which describes the time period over which current measured values DPI of the consumer current I are recorded by the current measurement device 609 in the current measurement step 103. For reasons of clarity, no current measured values DPI are shown in the current-time diagram.

The first time interval $T_1$ and the second time interval $T_2$ are of the same length and thus describe an identical period of time in which measured voltage values DPU and measured current values DPI are recorded.

However, the first time interval $T_1$ and the second time interval $T_2$ are time-shifted with respect to each other and have different start times $t_U$, $t_I$.

Via synchronization according to synchronization step 209, a phase shift $\Delta\Phi$ of the supply voltage U and of the consumer current I may be determined by matching the first and second start times $t_U$, $t_I$ of the first and second time intervals $T_1$, $T_2$ to the global reference time. With this phase shift $\Delta\Phi$ for synchronization according to the synchronization step 209, a corresponding correction of the recorded measured voltage values DPU or measured current values DPI may be performed.

In case that e.g. the local clock of the voltage measuring device 607 serves as a global reference clock, the first start time $t_U$ may serve as a time stamp 915. By transmitting this time stamp 915 from the voltage measurement device 607 to the current measurement device 609, matching the first start time $t_U$ with the respective second start times $t_I$ of the current measurement devices 609 may result in synchronization of the voltage measurement device 607 and the current measurement devices 609 by relating the local clocks of the current measurement devices 609 to the reference clock of the voltage measurement device 607.

Figure 5:
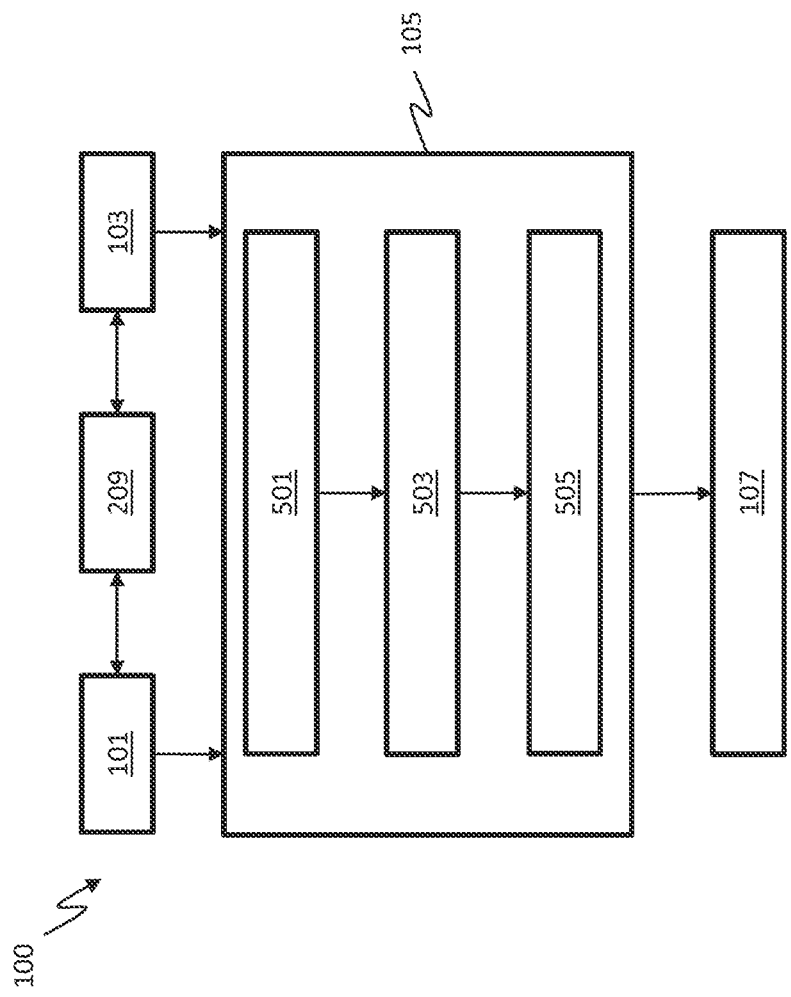
FIG. 5 is a flowchart of the method for distributed electrical power determination according to a further embodiment.

FIG. 5 shows a flowchart of the method 100 for distributed electrical power determination according to another embodiment.

Unless otherwise described, the method 100 in FIG. 5 comprises the steps described in FIG. 1 and FIG. 2.

According to FIG. 5, the analysis of the voltage measured values DPU and/or of the current measured values DPI according to the analysis step 105 is realized by performing, according to an adaptation step 501, an adaptation process of an adaptation function to the voltage measured values DPU and/or current measured values DPI to be analyzed.

An adaptation process may be a process in which, by varying corresponding parameters of a mathematical adaptation function, the latter is adapted to the measured voltage values DPU and/or measured current values DPI to be analyzed, so that after successful adaptation the adaptation function reproduces the measured voltage values DPU and/or the measured current values DPI and describes the respective voltage curves TCU or current curves TCI.

During the adaptation, the same adaptation function is used for the voltage measured values DPU and the current measured values DPI, respectively. The same parameters are also varied for the adjustment to the voltage measured values DPU and the current measured values DPI.

According to a parameter determination step 503, adapting the adaptation function to the voltage measured values DPU thus yields voltage parameters PU while adapting the adaptation function to the current measured values DPI yields current parameters PI.

The voltage parameters PU and the current parameters PI in this context describe the actual numerical values obtained for the respective parameters of the adaptation function by the adaptation process of the adaptation function to the voltage measured values DPU or the current measured values DPI. The voltage parameters PU and the current parameters PI are therefore merely different numerical values of the same parameter, and characterized by the fact that they are obtained by the adaptation processes of the adaptation function to the voltage measured values DPU and the current measured values DPI.

The type of parameters selected and varied for adapting the adaptation function to the measured voltage values DPU or the measured current values DPI depend on the selected adaptation function. The selection of the suitable adaptation function may in turn depend on the voltage curve TCU of the supply voltage U and/or the current curve TCI of the consumer current I of the voltage measured values DPU and/or current measured values DPI.

Upon successful adapting of the adaptation function to the voltage measurements DPU and/or the current measurements DPI, a parameter identification step 505 identifies the voltage parameters PU as voltage characteristics AFPU and/or the current parameters PI as current characteristics AFPI.

In the subsequent power value determination step 107, at least one power value L is determined taking into account the voltage characteristics AFPU and/or current characteristics AFPI.

If voltage measured values DPU or current measured values DPI have not been analyzed in the analysis step 105, the determination of the at least one power value L according to the power value determination step 107 provides for a further analysis of these previously unanalyzed voltage measured values DPU or current measured values DPI by the adaptation process.

After the voltage characteristics AFPU or current characteristics AFPI have been successfully determined by analyzing the previously unanalyzed voltage measured values DPU or current measured values DPI, the at least one power value L may be determined on the basis of the voltage characteristics AFPU and the current characteristics AFPI.

Alternatively, the voltage characteristics AFPU or current characteristics AFPI determined in the analysis step 105 by the adaptation process of the adaptation function to the voltage measured values DPU and/or current measured values DPI may be transformed back to the corresponding voltage measured values DPU and/or current measured values DPI.

Such a reverse transformation may e.g. be achieved by inserting time values corresponding to the respective measured values into the adapted adaptation function in which the voltage parameters PU or current parameters PI are inserted and which consequently describes the voltage curve TCU of the supply voltage U or the current curve TCI of the consumer current I of the measured voltage values DPU or of the measured current values DPI in order to thus obtain the corresponding measured voltage values DPU or measured current values DPI.

If voltage measured values DPU or current measured values DPI have not been analyzed in analysis step 105 and no corresponding voltage characteristic values AFPU or current characteristic values AFPU have been determined, these voltage measured values DPU or current measured values DPI remain unchanged in the following.

A power determination of the at least one power value L is then possible taking into account the voltage measured values DPU and current measured values DPI obtained in this way, e.g. by multiplying individual voltage measured values DPU and current measured values DPI.

FIG. 6 shows a schematic diagram of a system 600 for distributed electrical power determination according to an embodiment.

According to FIG. 6, the distributed electrical power determination system 600 comprises a voltage source 601 for providing a supply voltage U, at least one consumer 605 connected to the voltage source 601 via a voltage path 603, a voltage measurement device 607 for measuring the supply voltage U at a voltage measurement point 613 on the voltage path 603, at least one current measuring device 609 for measuring a supply current I of the consumer 605 at a current measuring point 615 on the voltage path 603, a processor unit 611 for determining at least one power value L, and a control unit 617 for addressing the voltage measuring device 607 and the at least one current measuring device 609.

The voltage measurement device 607 is configured to record voltage measured values DPU of the supply voltage U to determine a voltage curve TCU of the supply voltage U, and to analyze the voltage measured values DPU with an analysis function AF in order to determine voltage characteristics AFPU of the voltage curve TCU of the voltage measured values DPU.

Furthermore, the voltage measurement device 607 is configured to generate a first data packet DP1 comprising the voltage characteristics AFPU and to transmit the first data packet DP1 to the at least one processing unit 611.

The at least one current measurement device 609 is configured to record current measured values DPI of the consumer current I to determine a current curve TCI of the consumer current I, and to analyze the current measured values DPI with the analysis function AF to determine current characteristics AFPI of the current curve TCI of the current measured values DPI.

Furthermore, the current measurement device 609 is configured to generate a second data packet DP2 comprising current characteristics AFPI and to transmit the second data packet DP2 to the at least one processing unit 611.

The at least one processor unit 611 is embodied to determine at least one power value L taking into account the voltage characteristics AFPU and/or the current characteristics AFPI.

The system 600 further comprises a control unit 617, by which the voltage measuring device 607 and the current measuring devices 609 may be addressed and/or by which a distributed power determination may be initialized. The control unit 617 may be an internal control unit 617 integrated in the system or an external control unit 617.

The control unit 617, the voltage measuring device 607 and the current measuring devices 609 may be connected to one another via a communication link 619. The communication link 619 may be a data bus, which in turn may e.g. be implemented by a fieldbus system. The communication between the control device 607 and the voltage measuring device 607 and the current measuring devices 609 may be carried out by a data communication via the data bus, e.g. via the exchange of corresponding data packets. Here, the data packets may meet the requirements of certain bus protocols and may e.g. be embodied as Ethernet protocols or EtherCAT protocols.

In FIG. 6, the system 600 includes three consumers 605, each of which is connected to the voltage source 601 via the voltage path 603. Each of the consumers 605 has a current measuring device 609 connected in series with the respective consumer 605 to determine the consumer current I of the respective consumer 605. However, a higher or lower number of consumers 605 is conceivable, as well.

In FIG. 6, the voltage source 601 provides a three-phase AC voltage. However, the invention is not intended to be limited to this.

In the embodiment shown in FIG. 6, each of the current measurement devices 609 includes a processor 611 embodied in the respective current measurement device 609.

However, it is also conceivable to arrange the processor 611 in the voltage measurement device 607 or to embody it as an external processor 611.

The one voltage measurement device 607 and the three current measurement devices 609 are connected to one another via a communication link 619, by which the voltage measurement device 607 is able to transmit a first data packet DP1 with voltage characteristics DPU from an analysis of the voltage measurements DPU of the supply voltage U to the individual current measurement devices 609.

This first data packet DP1 may e.g. be integrated into a bus protocol of a bus system. For example, such a bus protocol may be implemented by an Ethernet telegram ET or by an EtherCAT telegram.

For a distributed power determination of at least one power value L, the voltage measurement device 607 records voltage measured values DPU of the supply voltage U at a voltage measurement point 613 according to the voltage measurement step 101 of the distributed power determination method 100.

According to the current measurement step 103, the current measurement devices 609 record current measured values DPI of the consumer current I at current measurement points 615.

The voltage measurement points 613 and the current measurement points 615 are spatially located at different locations in the system 600.

Subsequently, the voltage measurement device 607 analyzes the voltage measurements DPU using an analysis function AF and generates voltage characteristics AFPU according to the analysis step 105 of the method 100.

For example, to analyze the voltage measured values DPU in the analysis step 105, the voltage measurement device 607 may perform a spectral analysis according to the spectral analysis step 201, the spectrum generation step 203, the reduction step 205, and the spectral value identification step 207.

Alternatively, the voltage measurement device 607 may perform an analysis of the voltage measured values DPU using an adaptation function according to the adaptation step 501, the parameter determination step 503, and the parameter identification step 505.

Subsequently, the voltage measurement device 607 generates a first data packet DP1 containing the voltage characteristics AFPU and transmits it to the current measurement devices 609 via the communication link 619.

The current measurement devices 609 record current measured values DPI in the current measurement step 103 and may already analyze them in the analysis step 105, e.g. by the spectral analysis according to the spectral analysis step 201, the spectrum generation step 203, the reduction step 205 and the spectral value identification step 207, and determine the current characteristics AFPI.

Alternatively, the current measurement devices 609 and/or the processor units 611 embodied herein, may also analyze the current measured values DPI and determine current characteristics AFPI only in a power value determination step 107 to determine the at least one power value L based on the voltage characteristics AFPU and the current characteristics AFPI.

It is also possible for the voltage characteristics AFPU transmitted in the first data packet DP1 to the current measurement devices 609 to be transformed back into the voltage measured values DPU by the current measurement devices 609, or by the processor units 611 embodied therein, in order to determine the at least one power value L on the basis of the voltage measured values DPU and current measured values DPI.

To synchronize the voltage measurement device 607 and the current measurement devices 609, the voltage measurement device 607 and the current measurement devices 609 each have individual local timing. For example, the voltage measuring device 607 and the current measuring devices 609 may each be embodied having a local clock.

Synchronization may be achieved according to the synchronization step 209 by matching the internal local clocks of the voltage device 607 and the current measurement devices 609 with a global time determination, such as a global reference clock of the system 600.

For example, one of the local clocks of the voltage measurement device 607 and the current measurement devices 609 may also serve as the global reference clock. In this case, the local clocks that do not serve as the global reference clock may be aligned with the global reference clock by the respective voltage measuring device 607 or current measuring device 609 that is embodied with the global reference clock sending corresponding time determinations to the respective other voltage measuring devices 607 or current measuring devices 609, by which the local clocks of the voltage measuring device 607 or current measuring devices 609 may be matched.

For the system 600 shown in FIG. 6, in which the voltage measurement device 607 is located upstream of the current measurement devices 609, the local clock of the voltage measurement device 607 may be a global reference clock.

For synchronization, a reference clock time of the global reference clock may be transmitted from the voltage measurement device 607 to the current measurement devices 609 by a first data packet DP1 so that the local clocks of the current measurement devices 609 may be related to the reference clock time of the reference clock.

The data transmission of the first data packets DP1 and/or second data packets DP2 between the voltage measuring device 607 and/or the current measuring devices 609, or the processor units 611 embodied in these, respectively, may be realized by the communication link 619 which is formed in FIG. 6 between the voltage measuring device 607 and the current measuring devices 609.

As mentioned above, the control unit 617, the voltage measurement device 607 and the current measurement devices 609 may be integrated into a fieldbus system, such as an Ethernet network.

In Ethernet networks, the majority of subscribers are connected to each other via a common transmission medium, with the data to be transmitted being encapsulated in so-called Ethernet data packets, also referred to as Ethernet telegrams in the following, with a predefined format.

The Ethernet consists of three areas, the transmission medium and the network interfaces, i.e. the hardware, the set of protocols that control access to the transmission medium, and the Ethernet packet form. The Ethernet basically represents a bus network, wherein any network topologies, e.g. star, bus or tree networks, may be used.

Ethernet data transmission usually takes place using the CSMA/CD access method, in which a data transmission is only carried out when the network is quiet, i.e. no other data is being transmitted at this time. In addition, a collision prevention mechanism is provided.

The Ethernet data packet itself may have a data length of up to 1500 bytes, with the data encapsulated by headers and trailers that specify an initial identifier, the destination and source addresses, the data packet type, and the error detection mechanism.

The Ethernet has established itself as a communication standard for network systems, especially in office communication, since standard hardware components and software protocols may be used and, in addition, high data transmission rates are possible. For this reason, it is also desirable to be able to use the Ethernet standard in industrial environments for data transmission, especially of control tasks.

The essential problem here is the lack of real-time capability of the Ethernet standard, so that automation tasks with real-time applications are usually carried out separately from Ethernet communication networks in independent control modules, so-called fieldbus systems.

In order to be able to use the Ethernet standard and a correspondingly embodied network in a simple and cost-effective way also for the execution of automation tasks, especially those where the individual subscribers involved in the control require process data of only a few bytes, a network structure may be realized in which an additional network coupler, also referred to as Ethernet coupler in the following, is provided that has an external interface for the connection to an Ethernet network.

Figure 7:
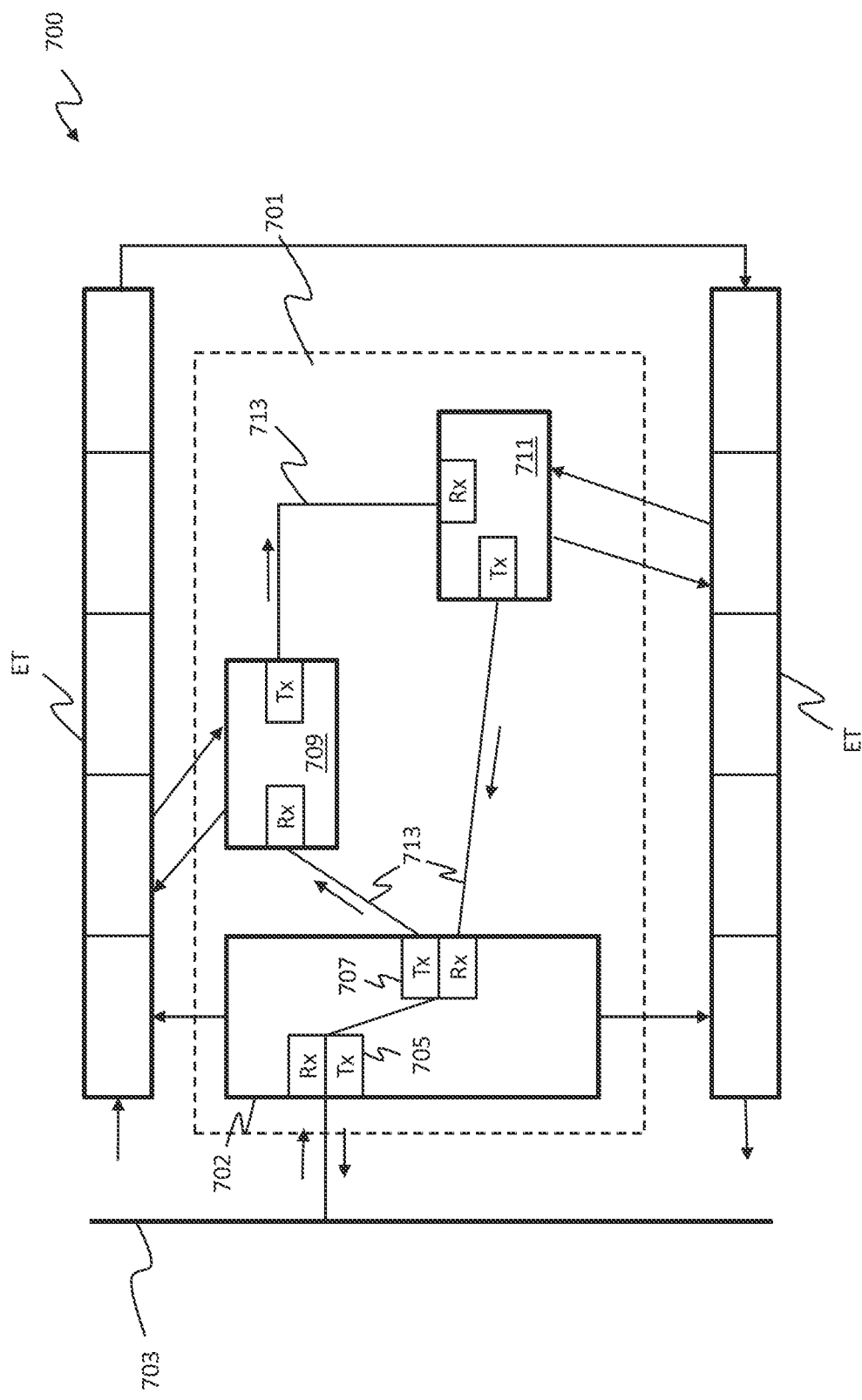

FIG. 7 shows a schematic diagram of an Ethernet network assembly 700 having an Ethernet terminal system 701 connected to an external data bus 703 of an Ethernet network.

The Ethernet terminal system 701 comprises an Ethernet coupler 702 and a voltage measuring device terminal 709 and at least one current measuring device terminal 711. The Ethernet coupler 702 and the respective voltage and current measuring device terminals 709, 711 are mechanically and electrically connected to one another. Of course, further electronic terminals may be integrated into the Ethernet terminal system 701 between the Ethernet coupler 702, the voltage measuring device terminal 709 and/or the current measuring device terminal 711.

The voltage measurement device terminal 709 and the current measurement device terminals 711 are embodied as Ethernet terminals and are each used to connect the voltage measurement device 607 and the current measurement device 609 (shown in FIG. 6) to the Ethernet network, in particular to the external data bus 703.

The Ethernet coupler 702, the voltage measuring device terminal 709 and the current measuring device terminal 711 are connected to one another via an internal data bus 713, which serves for data communication.

With the Ethernet coupler 702, the Ethernet terminal system 701 is connected to the external data bus 703. Via the external data bus 703, the voltage measuring device 607 and current measuring device 609 connected to the voltage measuring device terminal 709 and the current measuring device terminal 711, respectively, are controllable via the control unit 617. The control unit 617 (shown in FIG. 6) is connected to the external data bus 703. In FIG. 7, the communication link 619 of the system 600 in FIG. 6 is implemented by the external data bus 703 and the internal data bus 713.

To control the voltage measurement device 607 and the current measurement device 609 by the control unit 617, the control unit 617 may send out Ethernet telegrams ET to the voltage measurement device terminal 709 and the current measurement device terminal 711 comprising the corresponding instructions from the control unit 617 to the voltage measurement device 607 and the current measurement device 609.

The Ethernet coupler 702 has an external interface 705 and an internal interface 707 for connecting the Ethernet terminal system 701 to the external data bus 703, and serves to connect the external data bus 703 and the internal data bus 713, which is used for data communication within the Ethernet terminal system 701, and to implement data transmission between the two systems.

In the embodiment shown in FIG. 7, the Ethernet coupler 702 with the external interface 705 is directly connected to the external data bus 703, which may e.g. comprise a coaxial cable, a twisted pair cable or a fiber optic cable as transmission medium.

The external interface 705 and the internal interface 707 each have a receiving unit RX and a transmitting unit TX, by which Ethernet telegrams ET may be received and transmitted.

With the receiving unit RX of the external interface 705, the Ethernet coupler 702 receives an Ethernet telegram ET sent out by the control unit 617 via the external data bus 703 and sends this Ethernet telegram ET to the voltage measuring device terminal 709 and the current measuring device terminal 711 of the terminal system 701 by the sending unit TX of the internal interface 707 via the internal data bus 713.

The voltage measuring device terminal 709 and the current measuring device terminal 711 each also have a receiving unit RX by which Ethernet telegrams ET may be received, and a transmitting unit TX by which Ethernet telegrams ET may be transmitted.

The Ethernet telegram ET sent out by the Ethernet coupler 702 via the internal data bus 713 (shown in FIG. 7 as the upper Ethernet telegram ET) is received by the voltage measuring device terminal 709 via the receiving unit RX.

The voltage measuring device terminal 709 reads the received Ethernet telegram ET in the section of the Ethernet telegram ET intended for the voltage measuring device terminal 709.

For example, the voltage measurement device terminal 709 takes from the respective instructions of the Ethernet telegram ET intended for it the requests to the voltage measurement device 607 to record voltage measured values DPU, to analyze them and to determine voltage characteristics AFPU and/or to output the voltage characteristics AFPU.

For example, these voltage characteristics AFPU may already be inserted into first data packets DPI in the Ethernet telegram ET.

Subsequently, the voltage measurement device terminal 709 e.g. inserts voltage measured values DPU or voltage characteristics AFPU of the voltage measurement device 607 into the corresponding section of the Ethernet telegram ET.

Reading out and inserting the data is shown by the arrows between the voltage measuring device terminal 709 and the Ethernet telegram ET.

Subsequently, the voltage measuring device terminal 709 sends the Ethernet telegram ET to the current measuring device terminal 711 by the transmitting unit TX via the internal data bus 713.

The direction of transmission is indicated by the arrows along the internal data bus 713.

The current measuring device terminal 711 receives the Ethernet telegram ET by the receiving unit RX and reads it out.

The current measurement device terminal 711 in turn takes the appropriate instructions from the Ethernet telegram ET from the section intended for the current measurement device terminal 711 and e.g. inserts current measured values DPI or current characteristics AFPI of the current measurement device 609 into the Ethernet telegram ET.

Reading out and inserting the data is shown by the arrows between the current measuring device terminal 711 and the Ethernet telegram ET (in this case the lower Ethernet telegram).

Subsequently, the current measurement device terminal 711 sends the Ethernet telegram ET back to the bus coupler 702, which sends the Ethernet telegram ET back to the controller 617 via the external interface 705 and the external data bus 703 for evaluation of the respective data.

The upper and lower Ethernet telegram ET both represent the same Ethernet telegram ET and are intended to illustrate that after the respective instructions of the Ethernet telegram ET have been processed by the voltage and current measurement device terminals 709, 711, the Ethernet telegram ET is sent back to the bus coupler 702.

The Ethernet telegram ET described above consists of a header with the receiving identifier and the destination and source address, a data area and a trailer that specifies a packet length and an error detection mechanism.

The data area provided between the header and the trailer contains the process data required for the control task, which preferably reflects an entire process image. These process data are in turn preferably grouped into data blocks required for the individual participants of the control task for the voltage measuring device terminal 709 or the voltage measuring device 607 and the current measuring device terminal 711 or the current measuring devices 609.

The process data may include instructions to the respective subscribers to perform certain process steps. For example, the process data may include instructions to the voltage measurement device 607 and/or current measurement devices 609 to record voltage measured values DPU or current measured values DPI or to analyze them and to generate voltage characteristics AFPU or current characteristics AFPI, respectively, and to determine at least one power value L, respectively.

Also, the process data may include previously established voltage characteristics AFPU and/or current characteristics AFPI for transmission between the voltage measurement device 607 and the current measurement devices 609.

Figure 8:
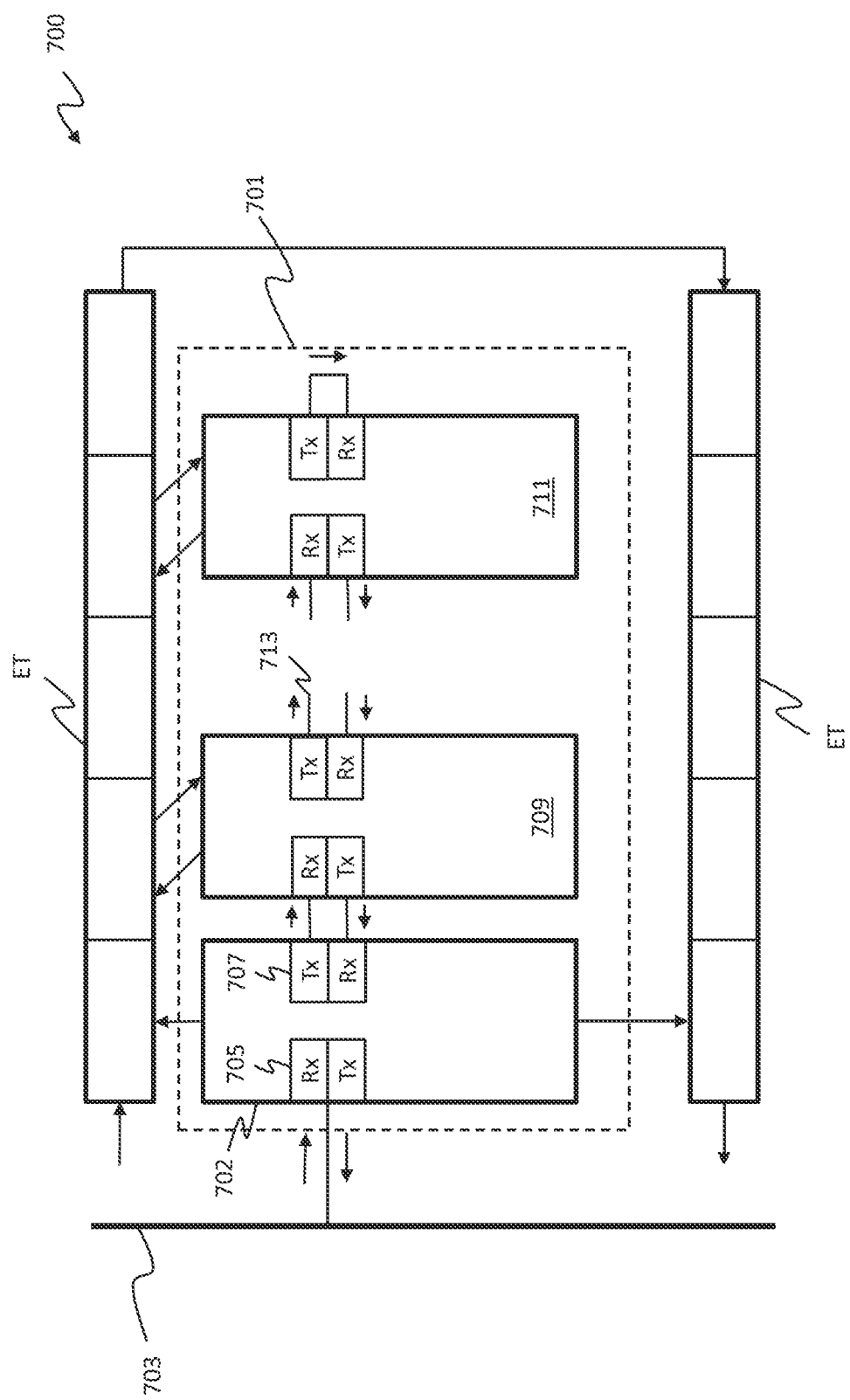
FIG. 8 is a schematic diagram of the Ethernet network structure in FIG. 7 according to a further embodiment.

In FIG. 8, a further embodiment of the Ethernet network assembly 700 in FIG. 7 is shown. In this embodiment, the Ethernet network assembly 700 is shown with a two-channel line.

In contrast to FIG. 7, in FIG. 8 the voltage measuring device terminal 709 and the current measuring device terminal 711 each have two receiving units RX and two transmitting units TX.

In FIG. 8, the Ethernet telegram ET sent from the Ethernet coupler 702 to the voltage measurement device terminal 709 passes through all terminals of the Ethernet terminal system 701 and is sent back to the Ethernet coupler 702 from the last current measurement device terminal 711 of the terminal system 701 through all connected terminals of the Ethernet terminal system 701, i.e. in the case shown at least through the voltage measurement device terminal 709.

However, a readout of the Ethernet telegram ET and an insertion of data into the Ethernet telegram ET by the voltage measurement device terminal 709 and the current measurement device terminal 711 takes place only on the forward run.

The readout and insertion is shown by the arrows to the upper Ethernet telegram ET and from it to the voltage measurement device terminal 709 and the current measurement device terminal 711.

On the way back, no processing of the Ethernet telegram ET takes place, but the Ethernet telegram ET is merely forwarded.

Provided that an Ethernet telegram ET according to the EtherCAT standard is used in the Ethernet terminal system 701 and the Ethernet coupler 702, the voltage measuring device terminal 709 and the current measuring device terminal 711 are embodied according to the EtherCAT standard, an exchange of data between the Ethernet telegram ET and the voltage measuring device terminal 709 and the current measuring device terminal 711 is possible when passing through. The advantages of this approach are that due to the processing of the Ethernet telegram ET when passing through no significant delays occur during data processing and thus short response times, as required for a real-time application, may be maintained.

Figure 9:
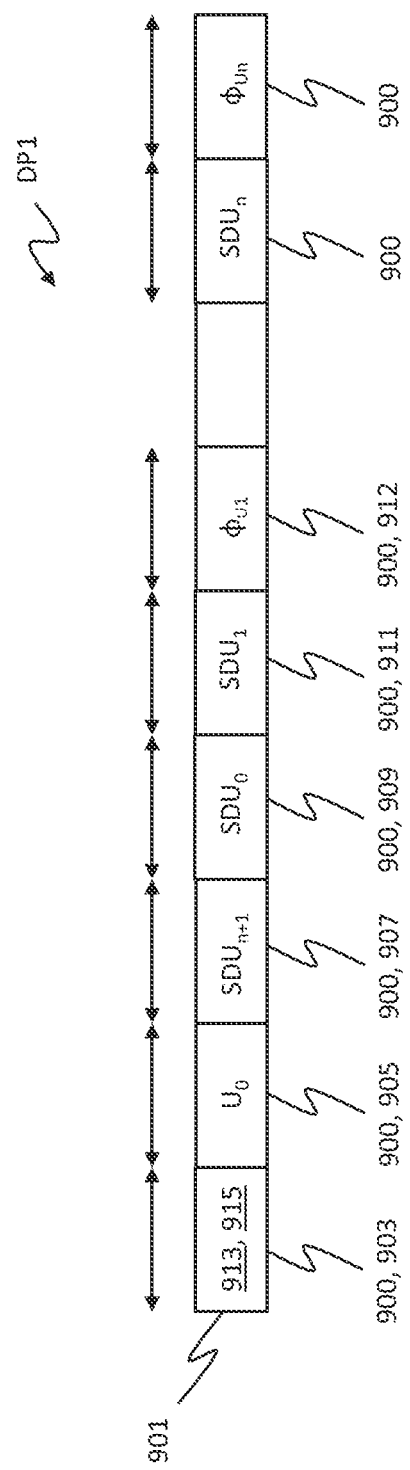
FIG. 9 is a schematic depiction of a first data packet of the method for distributed electrical power determination according to a further embodiment.

FIG. 9 shows a schematic depiction of a first data packet DP1 of the system 600 for distributed electrical power determination according to a further embodiment.

In order to transmit the voltage characteristics AFPU and/or current characteristics AFPI generated in the voltage measuring device 607 and/or the current measuring devices 609, these may be combined to first data packets DP1 and/or second data packets DP2.

For transmission, the first data packets DP1 and/or second data packets DP2 may e.g. be inserted into the Ethernet telegrams ET described above.

FIG. 9 shows a first data packet DP1 generated by the voltage measuring device 607. A second data packet DP2 generated by the current measuring device 607 may have a data structure analogous to the first data packet DP1, in which the current characteristics AFPI may be arranged analogously to the voltage characteristics AFPU shown in FIG. 7. To avoid repetition, the essential structure of the first data packet DP1 is described below.

According to FIG. 9, the first data packet DP1 has a data frame 901 comprising a plurality of data sections 900. The individual data sections 900 of the first data packet DP1 comprise various operating data and, in the embodiment shown, have a size of 4 bytes (each drawn with a double arrow).

In FIG. 9, the data sections 900 comprise voltage characteristics AFPU of the supply voltage U generated in the analysis step 105 by an analysis of voltage measurements DPU.

In the embodiment shown in FIG. 9, the voltage characteristics AFPU are analyzed by a spectral analysis of the voltage measured values DPU according to the spectral analysis step 201, the spectrum generation step 203, the reduction step 205 and the spectral value identification step 207. The voltage characteristics AFPU thus comprise information regarding the voltage fundamental and voltage harmonic frequencies $U_0$, $U_1$, ..., $U_n$ and voltage spectral values $SDU_0$, $SDU_1$, ..., $SDU_n$ of the voltage fundamental frequency $U_0$ and the first n voltage harmonics $U_1$, ..., $U_n$ as well as the voltage DC component $SDU_{n+1}$ of the supply voltage U.

When analyzing the voltage measured values DPU according to the analysis step 105 that have not been analyzed by a spectral analysis according to the spectral analysis step 201, the spectrum generation step 203, the reduction step 205, and the spectral value identification step, the distribution of the first data packet DP1 may differ from the distribution shown in FIG. 9.

The first data section 903 comprises a channel number 913 and a time stamp 915.

The channel number 913 identifies the phase of the possibly multi-phase supply voltage U for which the voltage measured values DPU were recorded by the voltage measurement device 607.

The time stamp 915 may e.g. be the start time $t_U$ of the first time interval $T_1$ that determines the time period for recording the voltage measured values DPU. The time stamp 915 or, respectively, the first start time $t_U$ is used to synchronize the voltage measurement device 607 and the current measurement devices 609 and is therefore transmitted to the processor unit 611 or the current measurement devices 609 within the first data packet DP1.

With the channel number 913 and the time stamp 915, the respective processing unit 611 is able to synchronize the voltage characteristics AFPU transmitted in the first data packet DP1 to corresponding current measured values DPI and current characteristics AFPI, respectively.

The second data section 905 comprises the frequency number of the voltage fundamental frequency $U_0$ of the supply voltage. The voltage fundamental frequency $U_0$ may be used to determine all voltage harmonic frequencies $U_1$, ..., $U_n$ of the supply voltage U as integer multiples of the voltage fundamental frequency $U_0$.

The third data section 907 comprises the corresponding voltage DC component $SDU_{n+1}$.

The fourth data section 909 comprises the voltage spectral value $SDU_0$ of the fundamental voltage frequency $U_0$.

The fifth data section 911 comprises the voltage spectral value $SDU_1$ of the first voltage harmonics $U_1$.

The sixth data section 912 includes a voltage phase angle $\Phi_{U1}$ of the first harmonic oscillation with respect to the fundamental oscillation.

In the following sections, the voltage spectral values $SDU_2$, ..., $SDU_n$ and the respective voltage phase angles $\Phi_{U2}$, ..., $\Phi_{Un}$ of the 2nd to the nth voltage harmonics $U_2$, ..., $U_n$ follow in pairs.

The first data packet DP1 embodied in such a way thus comprises a number of 4+2*(n−1) sections, where n is the number of determined voltage harmonics $U_1$, ..., $U_n$ to the voltage fundamental frequency $U_0$ of the supply voltage U. Since each section has a data type size of 4 bytes, the data frame 701 has a total data size of $n_{BYTES}=(4+2*(n-1))*4$.

Depending on the number n of determined voltage harmonics $U_1$, ..., $U_n$, the number of sections and the size of the first data packet DPI to be transmitted may vary.

A first data packet DP1 according to FIG. 9 has an information content comparable to the corresponding voltage measured values DPU. As shown above, the apparent power S, the active power P, the reactive power Q or the distortion reactive power D may be determined by the voltage spectral values $SDU_0$, $SDU_1$, $SDU_0$, the voltage DC component $SDU_{n+1}$ and the respective voltage phase angles $\Phi_{U1}$, ... $\Phi_{Un}$ of the fundamental voltage frequency $U_0$ and the first n voltage harmonics $U_1$, ..., $U_n$.

By a corresponding reverse transformation, the voltage spectral values $SDU_0$, $SDU_1$, ..., $SDU_n$ may be back transformed into the voltage measured values DPU taking into account the respective voltage phase angles $\Phi_{U1}$, ... $\Phi_{Un}$ of the fundamental voltage frequency U0 and the first n voltage harmonics $\Phi_{U1}$, ... $\Phi_{Un}$ and the voltage DC component $SDU_{n+1}$.

However, the total data size of the first data packet DP1 is much smaller than a data packet comprising the voltage measured values DPU, which may have an information content comparable to the first data packet DP1.

Figure 10:
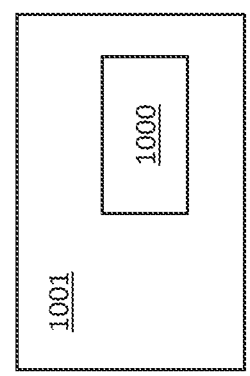
FIG. 10 is a schematic depiction of a storage medium comprising a computer program for executing the distributed electrical power determination method.

FIG. 10 shows a schematic illustration of a storage medium 1001 with a computer program 1000 for executing the method 100 for controlling an automation process.

This invention has been described with respect to exemplary embodiments. It is understood that changes can be made and equivalents can be substituted to adapt these disclosures to different materials and situations, while remaining with the scope of the invention. The invention is thus not limited to the particular examples that are disclosed, but encompasses all the embodiments that fall within the scope of the claims.

TABLE 1

List of Reference Numerals 100 method for distributed electrical power determination
101 voltage measurement step
103 current measurement step
105 analysis step
107 power value determination step
201 spectral analysis step
203 spectrum generation step
205 reduction step
207 spectral value identification step
209 synchronization step
401 phase shift determination step
501 adaptation step
503 voltage parameter determination step
505 parameter identification step
600 system for distributed electrical power determination
601 voltage source
603 voltage path
605 consumers
607 voltage measuring device
609 current measuring device
611 processor unit
613 voltage measuring point
615 current measuring point
617 control unit
619 communication link
700 Ethernet network structure
701 Ethernet terminal system
701 Ethernet coupler
703 external data bus
705 external interface
707 internal interface
709 voltage measuring device terminal
711 current measuring device terminal
713 internal data bus
900 data section
901 Data frame
903 first data section
905 second data section
907 third data section
909 fourth data section
911 fifth data section
913 Channel number
915 time stamp
1001 storage medium
1000 computer program List of Reference Symbols

| | |
|---|---|
| U supply voltage | I consumer current |
| DPU voltage measured value | DPI current measured value |
| TCU voltage curve | TCI current curve |
| AF analysis function | |
| AFPU voltage characteristic | AFPI current characteristic |
| $U_0$ voltage fundamental frequency | $I_0$ current fundamental frequency |
| $U_1, \ldots, U_n$ first n voltage harmonic frequencies | $I_1, \ldots, I_n$ first n current harmonics |
| $\Phi_{U1}, \ldots, \Phi_{Un}$ voltage phase angle of the first n harmonic oscillations to the fundamental oscillations of the power supply | $\Phi_{I1}, \ldots, \Phi_{In}$ current phase angle of the first n harmonic oscillations to the fundamental oscillations of the consumer current |
| SD frequency spectrum | SDU voltage frequency spectrum |
| $SDU_0$ voltage spectral value of the fundamental frequency of the supply voltage | $SDU_1, \ldots, SDU_n$ voltage spectral values of the first n harmonics of the supply voltage |
| $SDU_{n+1}$ voltage DC component | $SDI_{n+1}$ current DC component |
| $SDI_0$ current spectral value of the fundamental frequency of the consumer current | $SD_{I1}, \ldots, SD_{In}$ current spectral values of the first n harmonic frequencies of the consumer current |
| $\Delta\Phi$ Phase shift | SDI current frequency spectrum |
| PU voltage parameter | PI current parameter |
| DP1 first data packet | DP2 second data packet |
| t time | f frequency |
| $t_U$ first start time | $t_I$ second start time |

TABLE 1-continued

| | |
|---|---|
| T1 first time interval | T2 second time interval |
| RX receiving unit | TX transmitting unit |
| ET telegram | |
| P active power | Q reactive power |
| D distortion reactive power | |
| L power value | S total apparent power |

The invention claimed is:

1. A method for distributed electrical power determination of at least one consumer connected to a voltage source via a voltage path, wherein a voltage measuring device determines a supply voltage of the voltage source at a voltage measuring point on the voltage path, and wherein at least one current measuring device determines a consumer current of the consumer at a current measuring point on the voltage path, comprising the method steps:
  recording voltage readings of the supply voltage by the voltage measurement device to determine a voltage curve of the supply voltage in a voltage measurement step;
  recording current measured values of a consumer current of the at least one consumer by the at least one current measurement device for determining a current curve of the consumer current in a current measurement step;
  analyzing the voltage measured values of the supply voltage and/or the current measured values of the consumer current with an analysis function in an analysis step, in order to determine voltage characteristics of the voltage curve of the supply voltage and/or current characteristics of the current curve of the consumer current, the analysis of the voltage measured values of the supply voltage in the analysis step being carried out by the voltage measurement device, and/or
  wherein the analysis of the current measured values of the consumer current in the analysis step is performed by the at least one current measurement device, wherein the analysis function is a mathematical function, and wherein the voltage characteristics and/or the current characteristics are parameters of the analysis function;
  transmitting the voltage characteristics by the voltage measuring device to a processor unit and/or transmitting the current characteristics by the at least one current measuring device to the processor unit; and
  determining at least one power value taking into account the voltage characteristics of the voltage curve of the supply voltage and/or the current characteristics of the current curve of the consumer current by the processor unit in a power value determination step.

2. The method according to claim 1, wherein the step of analyzing the voltage measured values and/or the current measured values comprises the steps of:
  performing a spectral analysis, in particular a discrete Fourier analysis, of the voltage measured values and/or the current measured values in a spectral analysis step;
  creating a voltage frequency spectrum of the supply voltage based on the spectral analysis of the voltage measured values and/or a current frequency spectrum of the consumer current based on the spectral analysis of the current measurements in a spectrum generation step;
  reducing the voltage frequency spectrum of the supply voltage and/or the current frequency spectrum of the consumer current to frequencies of a voltage fundamental frequency and of first n voltage harmonic frequencies of the supply voltage and/or to frequencies of a current fundamental frequency and of first n current harmonic frequencies of the consumer current in a reduction step; and identifying the voltage spectral values for frequencies of the voltage fundamental frequency and of the first n voltage harmonic frequencies of the supply voltage as voltage characteristics and/or the current spectral values for frequencies of the fundamental current frequency and of the first n current harmonic frequencies of the consumer current as current characteristics in a spectral value identification step.

3. The method according to claim 1, wherein the step of analyzing the voltage measured values and/or the current measured values comprises the steps of:

performing an adaptation process of an adaptation function to the voltage measured values and/or the current measured values in an adaptation step;

determining voltage parameters of the adaptation function, the adaptation function with the voltage parameters describing the voltage curve of the supply voltage, and/or current parameters of the adaptation function, the adaptation function with the current parameters describing the current curve of the consumer current, in a parameter determining step; and identifying the voltage parameters of the adaptation function as voltage characteristics and/or the current parameters of the adaptation function as current characteristics in a parameter identification step.

4. The method according to claim 1, further comprising: synchronizing the voltage measuring device and the at least one current measuring device to a reference time in a synchronization step, wherein the voltage measuring device and the at least one current measuring device each determine a local time, and wherein the local time of the voltage measuring device and the local time of the at least one current measuring device are adjusted with respect to the reference time.

5. The method according to claim 4, wherein synchronizing the voltage measuring device and the at least one current measuring device in the synchronization step comprises determining a phase shift between the voltage curve of the supply voltage and the current curve of the consumer current in a phase shift determining step.

6. The method according to claim 1, wherein the at least one power value is an active power, a reactive power, a distortion reactive power, or a total apparent power.

7. A computer program comprising instructions that, when the computer program is executed by a computer or the control unit, cause the computer or the control unit to execute a method according to claim 1.

8. A non-transitory machine-readable storage medium on which a computer program is stored, wherein the computer program is executable by a computer processor to execute a method according to claim 1.

9. A system for distributed electrical power determination comprising:

a voltage source for providing a supply voltage, at least one consumer connected to the voltage source via at least one voltage path, voltage measurement device for measuring the supply voltage at a voltage measuring point on the voltage path, at least one current measuring device for measuring a supply current of the consumer at a current measuring point on the voltage path, a processor unit for generating at least one power value, and a control unit for addressing the voltage measuring device and the at least one current measuring device, wherein the voltage measuring device is embodied to record voltage measured values of the supply voltage in order to determine a voltage curve of the supply voltage, to analyze the voltage measured values with an analysis function, to determine voltage characteristics of the voltage curve of the voltage measured values, to generate a first data packet comprising the voltage characteristics, and to transmit the first data packet to the at least one processor unit, wherein the analysis function is a mathematical function, and wherein the voltage characteristics are parameters of the analysis function;

wherein the at least one current measuring device is embodied to record current measured values of the consumer current in order to determine a current curve of the consumer current, to analyze the current measured values using the analysis function, and to determine current characteristics of the current curve of the current measured values, to generate a second data packet comprising the current characteristics, and to transmit the second data packet to the at least one processing unit, wherein the current characteristics are parameters of the analysis function; and wherein the at least one processor unit is embodied to determine at least one power value taking into account the voltage characteristics and/or the current characteristics.

10. The system according to claim 9, wherein the voltage measurement device, the at least one current measurement device and the processor unit are embodied to analyze the voltage measured values and/or the current measured values with the analysis function:

to perform a spectral analysis, in particular a discrete Fourier analysis, of the voltage measured values and/or the current measured values;

to generate a voltage frequency spectrum of the supply voltage based on the spectral analysis of the voltage measured values and/or a current frequency spectrum of the consumer current based on the spectral analysis of the current measured values;

to reduce the voltage frequency spectrum of the supply voltage and/or the current frequency spectrum of the consumer current to voltage spectral values of a voltage fundamental frequency and of first n voltage harmonic frequency of the supply voltage and/or to current spectral values of a current fundamental frequency and of first n current harmonic frequencies of the consumer current; and to identify the voltage spectral values for frequencies of the voltage fundamental frequency and the first n voltage harmonic frequencies of the supply voltage as voltage characteristics and/or the current spectral values for frequencies of the fundamental current frequency and the first n current harmonic frequencies of the consumer current as current characteristics.

11. The system according to claim 9, wherein the voltage measurement device, the at least one current measurement device and the processor unit are embodied to analyze the voltage measured values and/or the current measured values with the analysis function:

to perform an adaptation process of an adaptation function to the voltage measured values and/or the current measured values;

to determine voltage parameters and/or current parameters of the adaptation function; and to identify the voltage parameters of the adaptation function as voltage characteristics and/or the current parameters of the adaptation function as current characteristics.

12. The system according to claim 9, further comprising at least one communication link between the voltage measuring device and the at least one processor unit and/or the at least one current measuring device and the at least one processor unit for transmitting the first data packet from the voltage measuring device to the at least one processor unit and/or the second data packet from the at least one current measuring device to the at least one processor unit.

13. The system according to claim 9, wherein the at least one processor unit is embodied in the voltage measuring device and/or in the at least one current measuring device or is an external processor unit.

14. The system according to claim 9, wherein the voltage measuring device and the at least one current measuring device may be synchronized to each other, wherein the voltage measuring device and the at least one current measuring device each have a local time for this purpose, and wherein the local times of the voltage measuring device and the at least one current measuring device may be matched to a global reference time of the system.

* * * * *